US008362565B2

(12) United States Patent
Kuroda

(10) Patent No.: US 8,362,565 B2
(45) Date of Patent: Jan. 29, 2013

(54) MEMORY ELEMENT WITH SMALL THRESHOLD VOLTAGE VARIANCE AND HIGH-SPEED LOGIC ELEMENT WITH LOW POWER CONSUMPTION

(75) Inventor: Hideaki Kuroda, Kanagawa (JP)

(73) Assignee: Sony Corporation, Tokyo (JP)

( * ) Notice: Subject to any disclaimer, the term of this patent is extended or adjusted under 35 U.S.C. 154(b) by 267 days.

(21) Appl. No.: 12/630,396

(22) Filed: Dec. 3, 2009

(65) Prior Publication Data

US 2010/0140710 A1 Jun. 10, 2010

(30) Foreign Application Priority Data

Dec. 5, 2008 (JP) ................. P2008-310667

(51) Int. Cl.
*H01L 29/66* (2006.01)
(52) U.S. Cl. ............. 257/365; 257/347; 257/E27.112; 438/144
(58) Field of Classification Search ............ 257/347, 257/365, E27.112; 438/144
See application file for complete search history.

(56) References Cited

U.S. PATENT DOCUMENTS 6,383,904 B1 * 5/2002 Yu .................................. 438/589
7,521,765 B2 * 4/2009 Tsutsumi et al. ............. 257/392

FOREIGN PATENT DOCUMENTS

| JP | 8-288400 | 11/1996 |
| JP | HEI 10-256560 | 9/1998 |
| JP | HEI 10-319907 | 12/1998 |
| JP | 2001-127300 | 5/2001 |
| JP | 2005-019453 | 1/2005 |
| WO | 2008/114716 A1 | 9/2008 |

OTHER PUBLICATIONS

Japanese Office Action issued on Nov. 24, 2010, for corresponding Japanese Patent Appln. No. 2008-310667.
Japanese Office Action issued Jul. 5, 2011, for corresponding Japanese Appln. No. 2008-310667.
Fenouillet-Beranger et al., "Fully-Depleted SOI Technology using High-K and Single-Metal Gate for 32nm Node LSTP Applications featuring 0.179um2 6T-SRAM bitcell", IEEE, 2007, pp. 267-270.
"AIST announces a novel SRAM circuit using finFET", Semiconductor International, Sep. 18, 2007.

* cited by examiner

*Primary Examiner* — Wael Fahmy
*Assistant Examiner* — John C Ingham
(74) *Attorney, Agent, or Firm* — K&L Gates LLP

(57) ABSTRACT

A semiconductor device includes: a semiconductor layer; an element isolation region formed in the semiconductor layer for separation between a memory element part and a logic element part; first and second field-effect transistors formed in the memory element part and having first and second gate electrodes on a first surface side of the semiconductor layer and a second surface side opposite to the first surface, respectively, and having a source and drain region in common with each other; a third field-effect transistor formed in the logic element part and having a third gate electrode on the second surface side; and first and second insulating films formed on the semiconductor layer to cover the first field-effect transistor and the second and third field-effect transistors, respectively. The first field-effect transistor and the second field-effect transistor are fully-depleted field-effect transistors. The first gate electrode and the second gate electrode are electrically connected.

6 Claims, 14 Drawing Sheets

MEMORY ELEMENT WITH SMALL THRESHOLD VOLTAGE VARIANCE AND HIGH-SPEED LOGIC ELEMENT WITH LOW POWER CONSUMPTION

CROSS REFERENCES TO RELATED APPLICATIONS

The present application claims priority Japanese Priority Patent Application JP 2008-310667 filed in the Japan Patent Office on Dec. 5, 2008, the entire contents of which is hereby incorporated by reference.

BACKGROUND

The present invention relates to a semiconductor device and a manufacturing method of the same.

For a logic device such as a CPU, an SRAM having good consistency in logic process is used as a main memory, and an SRAM that operates at a low voltage is desired for achieving lower power consumption of the device.

On the other hand, in a logic circuit part, in addition to the low-voltage operation, low-load capacity is an important factor for realizing the lower power consumption of the device.

The most major factor that determines the low-voltage operation margin of the microfabricated SRAM is variance of threshold voltage due to variations in impurities.

The variance of threshold voltage $\sigma Vt$ is given by the following equation (1) (see p. 279, *Fundamentals of Modern VLSI Devices* written by Taur and Ning).

$$\sigma Vt = q\sqrt{(Na \cdot Wdm0/(3LW))}/Cox \qquad (1)$$

Note that, in the equation (1), L is a gate length of a transistor, W is a gate width of the transistor, Na is channel impurity density, and Wdm0 is a channel depletion layer width. Further, Cox is gate capacity.

The variance of threshold voltage $\sigma Vt$ of the microfabricated MOSSFET having a small gate length L and a gate width W is suppressed in the following manner. For example, from the equation (1), a high-dielectric material such as hafnium oxide ($HfO_2$) and hafnium silicide oxynitride (HfSiON) is used for a gate insulating film and the film thickness Tox of the effective gate insulating film is made smaller. Alternatively, a fully-depleted SOI transistor (the threshold voltage Vt is not determined by Na but Vt is determined by a work function of the gate electrode material) is used (e.g., see C. Fenouillet-Beranger, et al., "Fully-Depleted SOI Technology using High-K and Single-Metal Gate for 32 nm Node LSTP Applications featuring 0.1 79 µm2 6T-SRAM bitcell", 2007 IEDM 10.7.

However, even when a High-K film is used for the gate insulating film, Tox is not significantly reduced, and $\sigma Vt$ eventually becomes a problem as scaling progresses.

In C. Fenouillet-Beranger, et al., an example of a 6T-SRAM using a fully-depleted SOI·FET is shown. For the FET, a high-dielectric (High-K) gate insulating film and a metal gate are used. In this way, $\sigma Vt$ can be made smaller by making Tox effectively smaller using the High-K film.

Specifically, right and left gates of an access transistor are independent and Vt of the access transistor is changed at reading out (High Vt) and writing (Low Vt) using a gate terminal for driving force adjustment. The Fin-FET is a vertical fully-depleted double-gate transistor, and the impurity density Na of the channels can take a small value by appropriate selection of the gate electrode material and $\sigma Vt$ can be made smaller as a result.

However, since the transistor structure is vertical, microfabrication of the gate electrode, ion implantation, formation of a diffusion layer, formation of a sidewall spacer, formation of salicide are difficult. Further, connection is made in a contact part with only a thin Si end, and the contact resistance is high. As a method of reducing the contact resistance, there is a method of epitaxially growing Si on the surface of the Si column for thickening only the connection part to the diffusion layer. However, the parasitic capacity between the gate electrode and the diffusion layer becomes larger, and the switching speed of the transistor becomes slower and the power consumption becomes higher.

As another example in related art, one in which a channel part is sandwiched by upper and lower gate electrodes, a DC bias is applied to the lower gate electrode, and the threshold voltage of the SW transistor is variably controlled is disclosed (e.g., see JP-2001-127300).

However, the example has a configuration in which independent control gates are provided on the rear surface of the BOX layer of the SOI substrate and the threshold voltage is adjusted with respect to each transistor, and, in order to reduce the variance of threshold voltage, it is necessary to optimize the gate bias on the rear surface with respect to each transistor. Accordingly, the circuit size becomes larger.

Further, as another example in related art, one in which integration is improved by vertically stacking PFETs of a two-input NAND circuit is disclosed. Note that, in the case of a two-input NOR circuit, NFETs are vertically stacked. The upper and lower gate electrodes are completely independently operated (e.g., see JP-08-288400).

The improvement in integration is intended by vertical stacking of two-input parallel transistors, however, different potentials are provided to the upper and the lower transistors, and thus, it is difficult to stabilize the potential of the common channel part and to realize the intended performance.

SUMMARY

There is need for solving the problem that it is difficult to realize a semiconductor device having a memory element part with small variance of threshold voltage and a high-speed logic element part operating at a low voltage with low-power consumption.

The present inventor has recognized that a semiconductor device having a high-speed logic element part with low-power consumption can be realized by using a transistor of a logic element part (logic circuit part) operating at a low voltage with low-load capacity and a transistor of a memory element part with small variance of threshold voltage.

A semiconductor device according to an embodiment includes a semiconductor layer; an element isolation region formed in the semiconductor layer for separation of the semiconductor layer into a memory element part and a logic element part; a first field-effect transistor formed in the memory element part of the semiconductor layer and having a first gate electrode on a first surface side of the semiconductor layer; a second field-effect transistor formed in the memory element part of the semiconductor layer and having a second gate electrode on a second surface side opposite to the first surface and a source and drain region in common with a source and drain region of the first field-effect transistor; a third field-effect transistor formed in the logic element part of the semiconductor layer and having a third gate electrode on the second surface side; a first insulating film formed on the semiconductor layer to cover the first field-effect transistor; and a second insulating film formed on the semiconductor layer to cover the second field-effect transistor and the third field-effect transistor, wherein the first field-effect transistor and the second field-effect transistor are fully-depleted field-effect transistors, and the first gate electrode and the second gate electrode are electrically connected.

In the semiconductor device according to an embodiment, the semiconductor layer is formed between the first insulating film and the second insulating film, and the semiconductor layer substantially has an SOI structure. The first field-effect transistor and the second field-effect transistor formed in the semiconductor layer are fully-depleted field-effect transistors, and do not leave any non-depleted region at operation in the semiconductor layer. That is, the semiconductor layer as the channel region is fully depleted. Accordingly, the channel density can be made lower while the leak of the memory cell transistor is suppressed, and σVth as variance of threshold voltage is significantly reduced.

Further, the third field-effect transistor formed in the logic element part may be a partially-depleted single-gate field-effect transistor operating at a low voltage with low-load capacity.

A manufacturing method (first manufacturing method) of a semiconductor device according to another embodiment includes the steps of: forming a first gate electrode of a first field-effect transistor on a front surface of a silicon layer to be a memory element part of an SOI substrate in which a substrate, an insulator layer, and the silicon layer are stacked via a first gate insulating film; forming a first insulating film covering the first gate electrode on the front surface of the silicon layer, and further forming a support substrate on the first insulating film; removing the substrate and the insulator layer to expose a rear surface of the silicon layer; forming an element isolation region for isolation of the memory element part and a logic element part in the silicon layer; forming a second gate electrode of a second field-effect transistor in a location facing the first gate electrode on the rear surface of the silicon layer to be the memory element part via a second gate insulating film, and forming a third gate electrode of a third field-effect transistor on the rear surface of the silicon layer to be the logic element part via a third gate insulating film; forming a first source and drain region as a source and drain region in common between the first field-effect transistor and the second field-effect transistor in the silicon layer at both sides of the first gate electrode and the second gate electrode, and forming a third source and drain region of the third field-effect transistor in the silicon layer at both sides of the third gate electrode; forming a contact portion connecting the first gate electrode and the second gate electrode in the element isolation region; and forming a second insulating film covering the second gate electrode and the third gate electrode on the rear surface of the silicon layer, wherein the first field-effect transistor and the second field-effect transistor are formed to be fully-depleted field-effect transistors.

A manufacturing method (second manufacturing method) of a semiconductor device according to still another embodiment includes the steps of: forming an element insulation region for isolation of a memory element part and a logic element part in a silicon layer of an SOI substrate in which a substrate, an insulator layer, and the silicon layer are stacked; forming a second gate electrode of a second field-effect transistor on a front surface of the silicon layer to be the memory element part via a second gate insulating film, and forming a third gate electrode of a third field-effect transistor on a front surface of the silicon layer to be the logic element part; forming a second source and drain region of the second field-effect transistor in the silicon layer at both sides of the second gate electrode, and forming a third source and drain region of the third field-effect transistor in the silicon layer at both sides of the third gate electrode; forming a second insulating film covering the second gate electrode and the third gate electrode on the front surface of the silicon layer, and further forming a support substrate on the second insulating film; removing the substrate and the insulator layer to expose a rear surface of the silicon layer; forming a first gate electrode of a first field-effect transistor in a location facing the second gate electrode on the rear surface of the silicon layer to be the memory element part via a first gate insulating film; forming a contact portion connecting the first gate electrode and the second gate electrode in the element isolation region; forming a first insulating film covering the first gate electrode on the rear surface side of the silicon layer, wherein the first field-effect transistor and the second field-effect transistor are formed to be fully-depleted field-effect transistors.

In the first and second manufacturing methods according to the embodiments, the first and second insulating films are formed on both surfaces of the silicon layer, and the silicon layer is formed to substantially have an SOI structure. The first and second field-effect transistors formed in the silicon layer are formed to be fully-depleted field-effect transistors, and do not leave any non-depleted region at operation in the silicon layer. That is, the silicon layer as the channel region is fully depleted. Accordingly, the channel density can be made lower while the leak of the memory cell transistor is suppressed, and σVth as variance of threshold voltage is significantly reduced. Further, the third field-effect transistor formed in the logic element part may be a partially-depleted single-gate field-effect transistor operating at a low voltage with low-load capacity.

In the semiconductor device according to the embodiment, σVth of the field-effect transistors of the memory element part can be significantly reduced and the field-effect transistor of the logic element part is a field-effect transistor operating at a low voltage with low-load capacity, and thereby, high-speed operation with low-power consumption can be realized.

In the first and second manufacturing methods according to the embodiments, σVth of the field-effect transistor of the memory element part can be significantly reduced and the field-effect transistor of the logic element part is a field-effect transistor operating at a low voltage with low-load capacity, and thereby, high-speed operation with low-power consumption can be realized.

Additional features and advantages are described herein, and will be apparent from the following Detailed Description and the figures.

DETAILED DESCRIPTION

The present application will be described below in greater detail with reference to the drawings according to an embodiment.

<1. First Embodiment>

[First Example of Configuration of Semiconductor Device]

Figure 1:
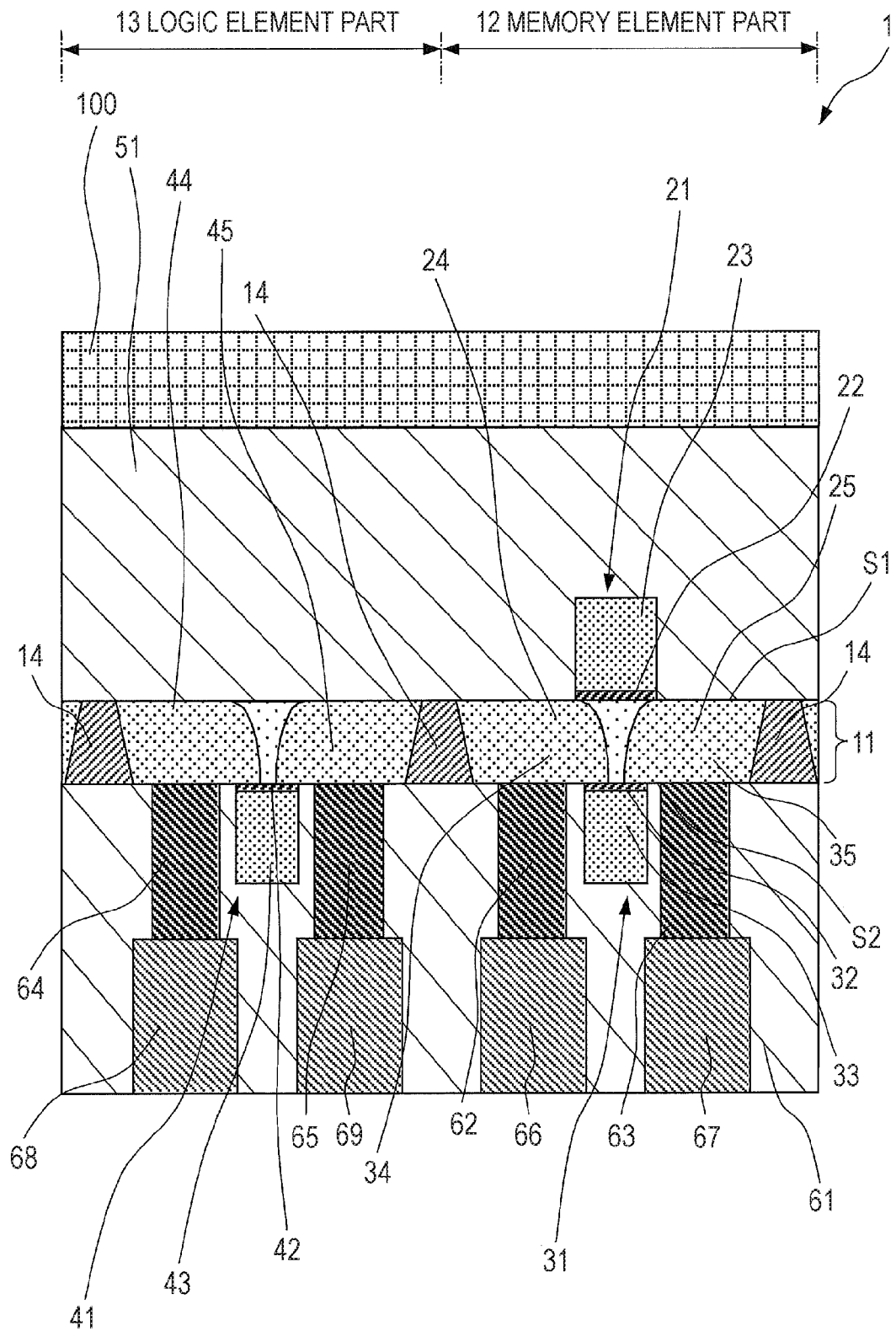
FIG. 1 is a schematic configuration sectional view showing a first example of a semiconductor device according to a first embodiment.

A first example of a configuration of a semiconductor device according to a first embodiment will be explained using a schematic configuration sectional view of FIG. 1. In FIG. 1, as an example, a transistor of a logic element circuit of a logic element part and an N-channel transistor of an SRAM cell as a memory element part are shown.

As shown in FIG. 1, the semiconductor device includes a semiconductor layer 11, and element isolation regions 14 that isolate a memory element part 12 and a logic element part 13 is formed in the semiconductor layer 11.

The semiconductor layer 11 is formed by a silicon layer, for example. The element isolation region 14 has an STI (Shallow Trench Isolation) structure, for example, and is formed by filling an element isolation groove formed in the semiconductor layer 11 with silicon oxide.

In the logic element part 13 of the semiconductor layer 11, a first field-effect transistor 21 having a first gate electrode 23 is formed on the first surface 51 (front surface) side of the semiconductor layer 11.

Further, in the memory element part 12 of the semiconductor layer 11, a second field-effect transistor 31 having a second gate electrode 33 is formed on the second surface S2 (rear surface) side opposite to the first surface 51. The second field-effect transistor 31 has a source and drain region in common with the first source and drain regions 24, 25 of the first field-effect transistor 21. Further, the first gate electrode 23 and the second gate electrode 33 are formed in locations opposed with a first gate insulating film 22, the semiconductor layer 11, and a second gate insulating film 32 in between.

Further, the first field-effect transistor 21 and the second field-effect transistor 31 are fully-depleted field-effect transistors.

Furthermore, the first gate electrode 23 and the second gate electrode 33 are electrically connected (not shown).

Moreover, in the logic element part 13 of the semiconductor layer 11, a third field-effect transistor 41 having a third gate electrode 43 is formed on the second surface S2 side of the semiconductor layer 11.

The third field-effect transistor 41 is a partially-depleted field-effect transistor.

Further, on the first surface S1 of the semiconductor layer 11, a first insulating film 51 to cover the first field-effect transistor 21 is formed. The first insulating film 51 is formed to have a thickness of several hundreds of nanometers or more, for example, and its surface is planarized. Furthermore, a support substrate 100 is formed on the first insulating film 51.

In addition, on the second surface S2 of the semiconductor layer 11, a second insulating film 61 to cover the second field-effect transistor 31 and the third field-effect transistor 41 is formed.

Here, the first, second, third field-effect transistors 21, 31, 41 will be explained in detail.

The first field-effect transistor 21 has the first gate electrode 23 formed on the first surface S1 of the semiconductor layer 11 via the first gate insulating film 22 and the first source and drain regions 24, 25 formed on the semiconductor layer 11 at both sides of the first gate electrode 23.

Accordingly, the part of the semiconductor layer 11 between the first source and drain regions 24, 25 serves as a channel region of the first field-effect transistor 21.

The first gate insulating film 22 is formed by a so-called high-dielectric (High-K) film expressed by a chemical formula of $HfO_2$, HfSiON, $ZrO_2$, or ZrSiON, for example, or a compound film of a thermally oxidized nitride film and the high-dielectric film.

The first gate electrode 23 is formed by titanium nitride, tantalum carbide, tungsten, or polysilicon, for example.

The second field-effect transistor 31 has the second gate electrode 33 formed on the second surface S2 of the semiconductor layer 11 via the second gate insulating film 32 and second source and drain regions 34, 35 formed on the semiconductor layer 11 at both sides of the second gate electrode 33.

Accordingly, the part of the semiconductor layer 11 between the second source and drain regions 34, 35 serves as a channel region of the second field-effect transistor 31 in common with the first field-effect transistor 21. Further, the second source and drain regions 34, 35 are formed by a diffusion layer in common with the first source and drain regions 24, 25.

The second gate insulating film 32 is formed by a so-called high-dielectric (High-K) film expressed by a chemical formula of $HfO_2$, HfSiON, $ZrO_2$, or ZrSiON, for example, or a compound film of a thermally oxidized nitride film and the high-dielectric film.

The second gate electrode 33 is formed by titanium nitride, tantalum carbide, tungsten, or polysilicon, for example.

Note that the gate length of the first gate electrode 23 is formed according to a distance between the second source and drain regions 34, 35 at the first surface S1 side, and may be formed longer than the gate length of the second gate electrode 33, for example. It is obvious that the first gate electrode 23 and the second gate electrode 33 are formed to have the same gate length when the distances between the first source and drain regions 24, 25 (second source and drain regions 34, 35) at the first surface S1 side and at the second surface S2 side are equal.

The third field-effect transistor 41 has the third gate electrode 43 formed on the second surface S2 of the semiconductor layer 11 via the third gate insulating film 42 and third source and drain regions 44, 45 formed on the semiconductor layer 11 at both sides of the third gate electrode 43.

Accordingly, the part of the semiconductor layer 11 between the third source and drain regions 44, 45 serves as a channel region of the third field-effect transistor 41.

The third gate insulating film 42 is formed by a so-called high-dielectric (High-K) film expressed by a chemical formula of $HfO_2$, HfSiON, $ZrO_2$, or ZrSiON, for example, or a compound film of a thermally oxidized nitride film and the high-dielectric film.

The third gate electrode 43 is formed by titanium nitride, tantalum carbide, tungsten, or polysilicon, for example.

Accordingly, there is no field-effect transistor of the logic element part 13 on the first surface S1 side of the semiconductor layer 11.

Further, on the second insulating film 61, contact portions 62, 63 connected to the second source and drain regions 34, 35 and contact portions 64, 65 connected to the third source and drain regions 44, 45 are formed. Furthermore, wires 66 to 69 connected to the contact portions 62 to 65 are formed.

Though not shown, the wire of the Nth layer (N≧2) and the (N−1)th contact portion connecting the wire of the Nth layer and the wire of the (N−1)th layer are formed. That is, the wires are formed by multilayer wiring.

The contact portions 62 to 65 are formed by a metal material of titanium, titanium nitride, tantalum, tantalum nitride, tungsten, copper, or the like, for example.

Next, an example of an electrically connected configuration of the first gate electrode 23 and the second gate electrode 33 will be explained.

Though not shown, the first gate electrode 23 and the second gate electrode 33 are formed to be led out to the element isolation region 14 side formed on the semiconductor layer 11. For example, as shown in the sectional view of FIG. 2, the first gate electrode 23 and the second gate electrode 33 led out to the element isolation region 14 are connected by a contact portion 16 formed by filling a contact hole 15 formed in the element isolation region 14. That is, the lower surface side of the first gate electrode 23 and one side surface side and the lower surface side of the second gate electrode 33 are connected by the contact portion 16.

The contact portion 16 is formed by a metal material of titanium, titanium nitride, tantalum, tantalum nitride, tungsten, copper, or the like, for example.

In the semiconductor device 1, the first gate electrode 23 of the first field-effect transistor 21 and the second gate electrode 33 of the second field-effect transistor 31 are electrically connected, and thereby, the same potential is provided to the first gate electrode 23 and the second gate electrode 33. Accordingly, the potential in the common channel part to the first field-effect transistor 21 and the second field-effect transistor 31 can be stabilized and the intended performance can be realized.

Note that, in the drawing, the first field-effect transistor 21 and the second field-effect transistor 31 are shown, however, the memory element part 12 is formed by plural field-effect transistors. The first field-effect transistor 21 and the second field-effect transistor 31 are part of them.

In the semiconductor device 1, the semiconductor layer 11 is formed between the first insulating film 51 and the second insulating film 61, and the semiconductor layer 11 substantially has an SOI structure. The first field-effect transistor 21 and the second field-effect transistor 31 formed on the semiconductor layer 11 are fully-depleted field-effect transistors, and do not leave any non-depleted region at operation in the semiconductor layer. That is, the semiconductor layer 11 as the channel region is fully depleted.

Accordingly, the channel density can be made lower while the leak of the memory cell transistor is suppressed, and σVth as variance of threshold voltage is significantly reduced.

Further, the third field-effect transistor 41 formed in the logic element part 13 may be a partially-depleted single-gate field-effect transistor operating at a low voltage with low-load capacity.

Therefore, σVth of the first and second field-effect transistors 21, 31 of the memory element part 12 can be significantly reduced and the third field-effect transistor 41 of the logic element part 13 is a field-effect transistor operating at a low voltage with low-load capacity, and thereby, high-speed operation with low-power consumption can be realized.

Figure 3:
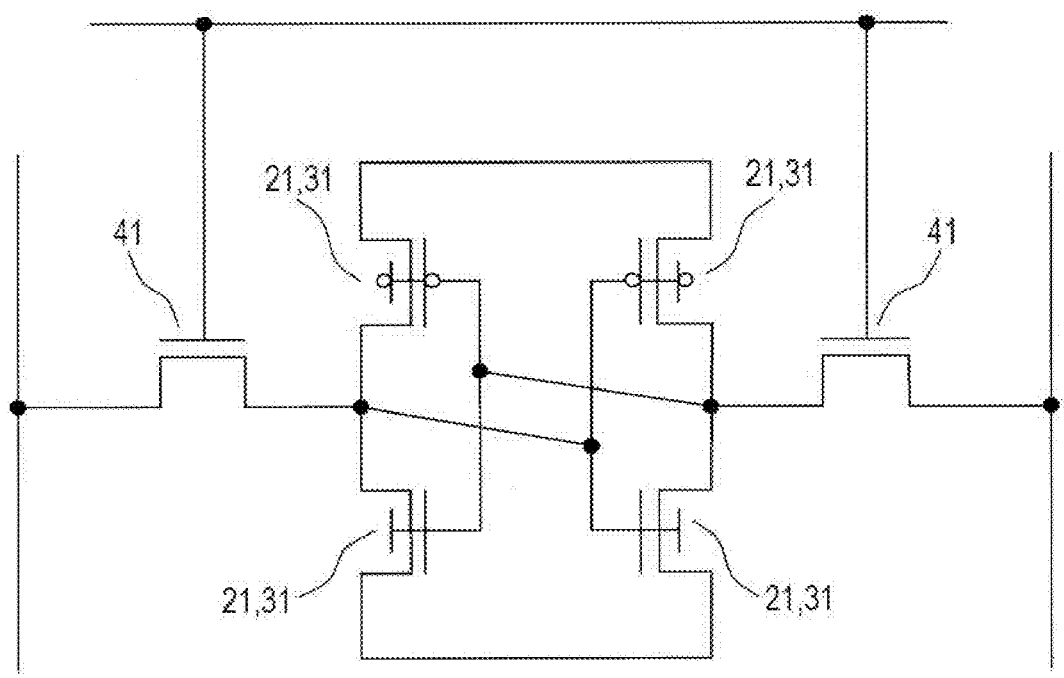
FIG. 3 is a circuit diagram showing one example of SRAM according to an embodiment.
Figure 4:
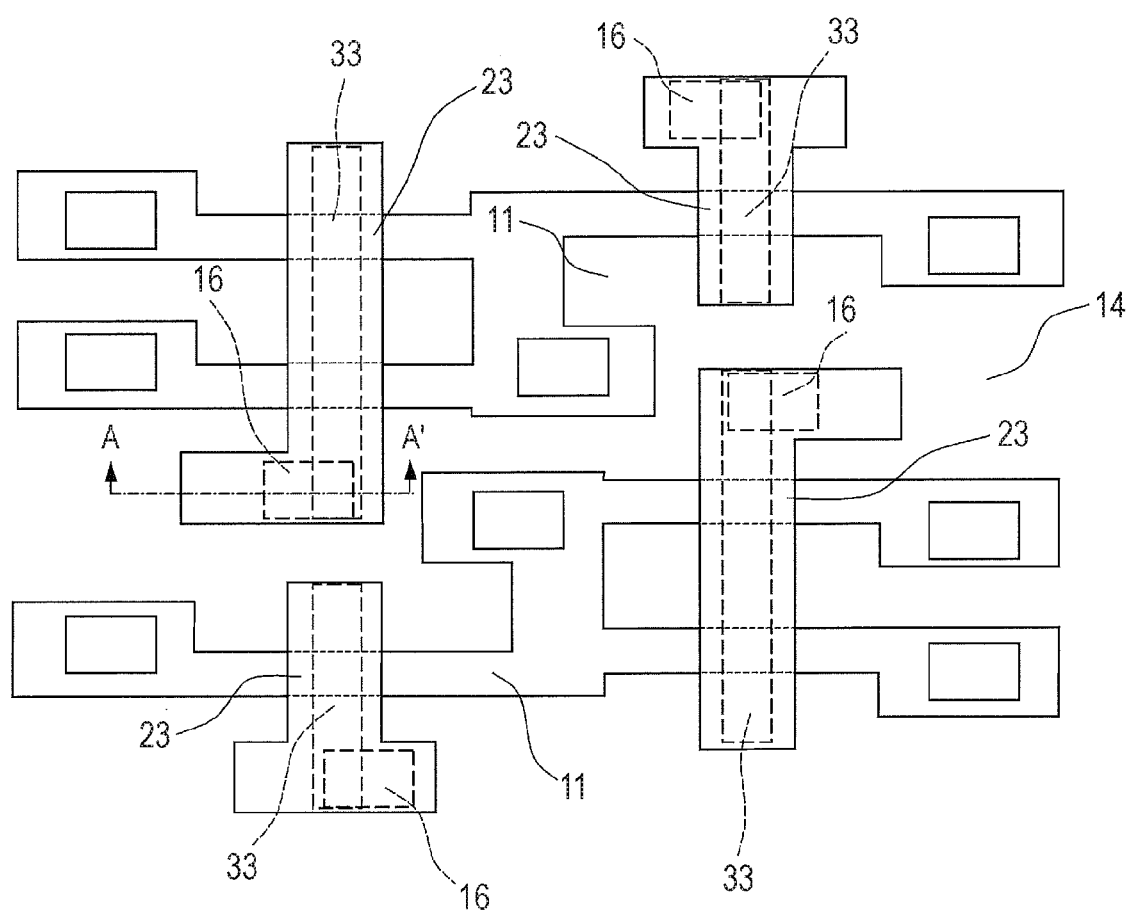
FIG. 4 is a planar layout diagram showing one example of SRAM according to an embodiment.

The semiconductor device 1 may be applied to an SRAM as shown in the circuit diagram of FIG. 3 and the layout diagram of FIG. 4, for example.

One of the first gate electrode 23 of the first field-effect transistor 21 formed on the upper surface side of the semiconductor layer 11 and the second gate electrode 33 of the second field-effect transistor 31 formed on the lower surface side of the semiconductor layer 11 is provided at the inner side of the other in the planar layout. In the drawings, as an example, the second gate electrode 33 is provided at the inner side of the first gate electrode 23 in the planar layout. Even in consideration of misalignment of the second gate electrode 33 and the first gate electrode 23, the second gate electrode 33 is provided at the inner side of the first gate electrode 23 in the planar layout.

Figure 5:
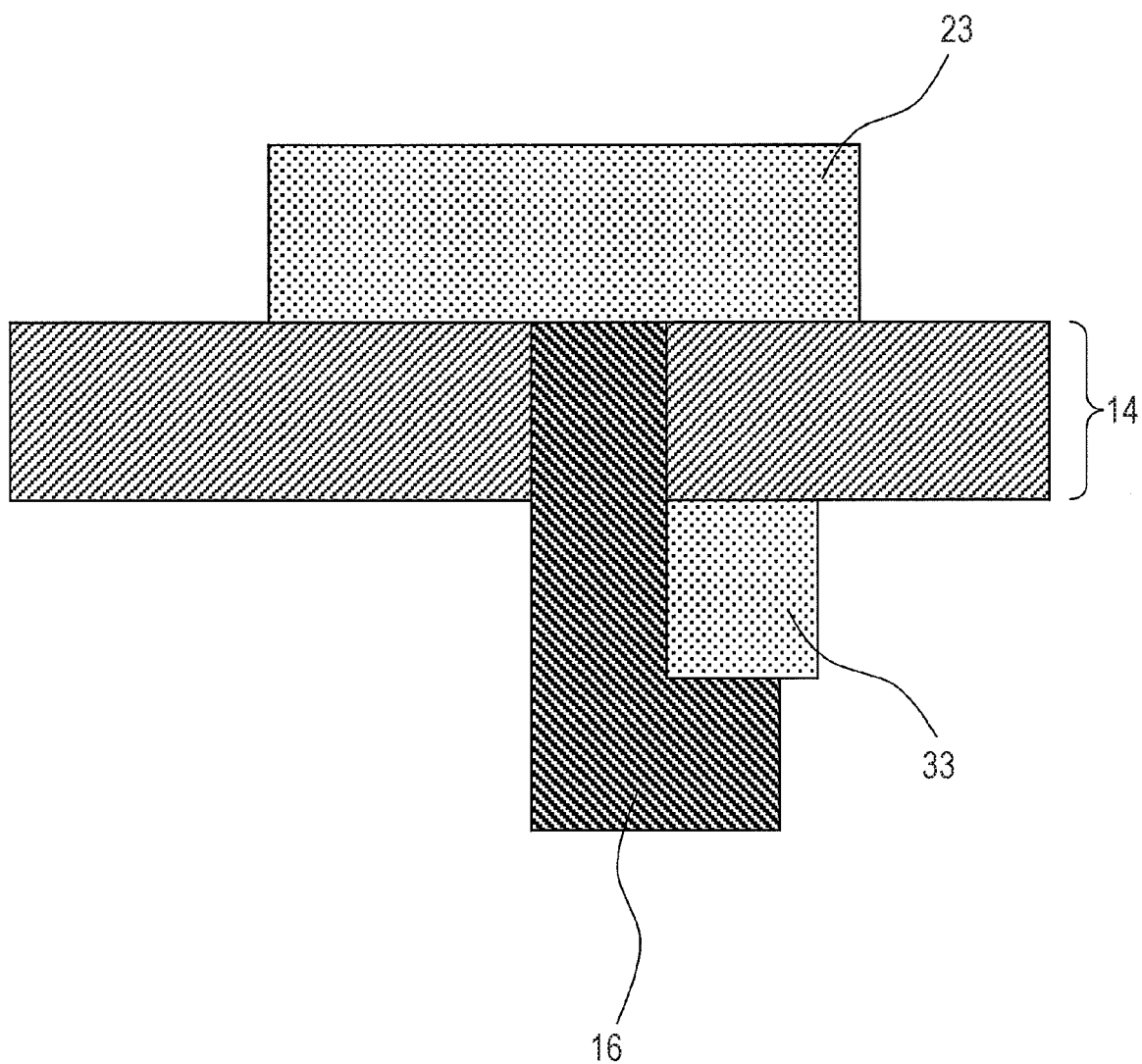
FIG. 5 is a sectional view showing a section along A-A' line in FIG. 4.

Further, as shown in the sectional view of FIG. 5 along the A-A' line in FIG. 4, the first gate electrode 23 and the second gate electrode 33 are electrically connected by the contact portion 16 formed through the element isolation region 14 formed in the semiconductor layer 11.

<2. Second Embodiment>

[Second Example of Configuration of Semiconductor Device]

Figure 6:
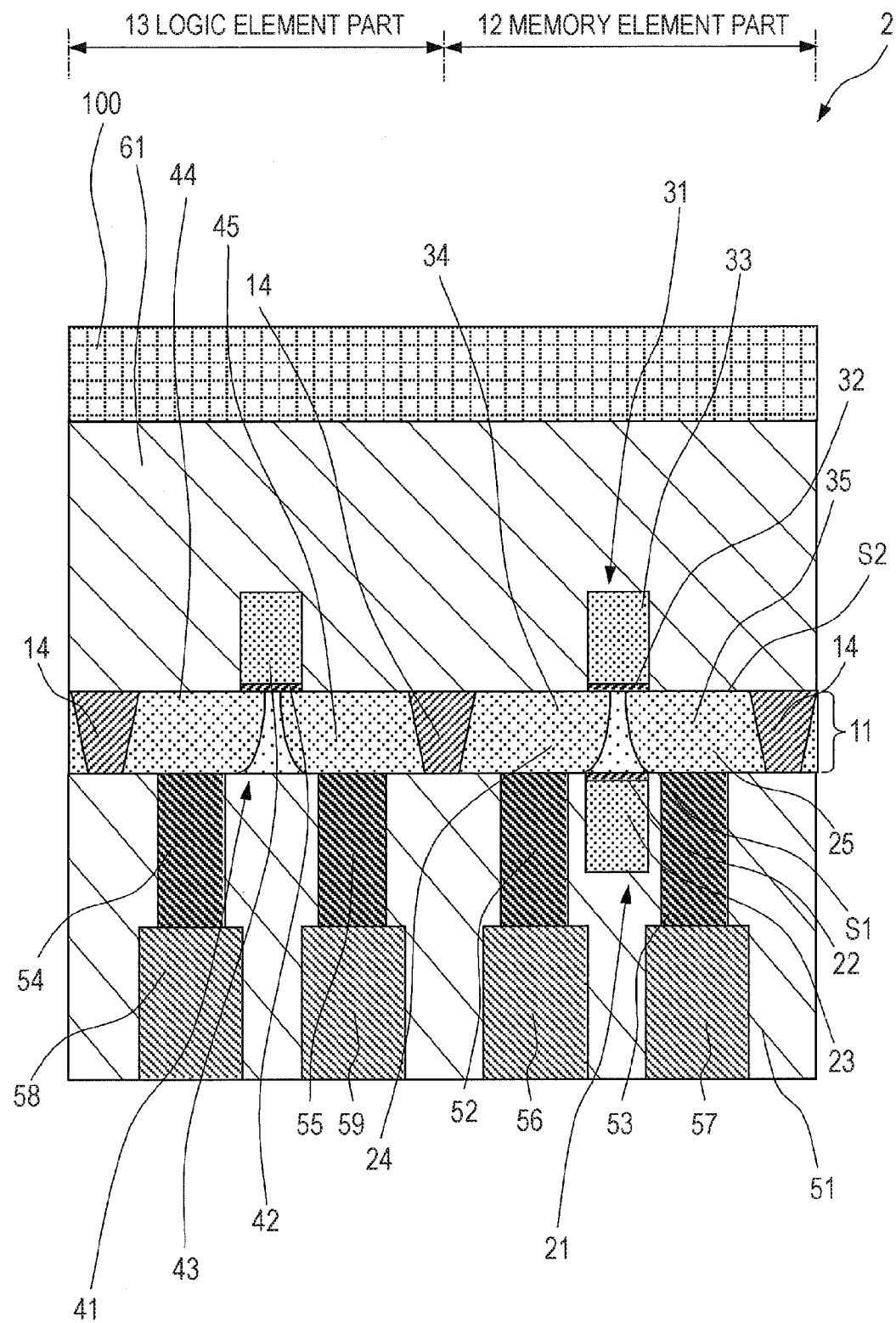
FIG. 6 is a schematic configuration sectional view showing a second example of a semiconductor device according to a second embodiment.

A second example of a configuration of a semiconductor device according to a second embodiment will be explained using a schematic configuration sectional view of FIG. 6. In FIG. 6, as an example, a transistor of a logic element circuit of a logic element part and an N-channel transistor of an SRAM cell as a memory element part are shown.

As shown in FIG. 6, the semiconductor device includes a semiconductor layer 11, and element isolation regions 14 that isolate a memory element part 12 and a logic element part 13 is formed in the semiconductor layer 11.

The semiconductor layer 11 is formed by a silicon layer, for example. The element isolation region 14 has an STI (Shallow Trench Isolation) structure, for example, and is formed by filling an element isolation groove formed in the semiconductor layer 11 with silicon oxide.

In the memory element part 13 of the semiconductor layer 11, a first field-effect transistor 21 having a first gate electrode 23 is formed on the first surface S1 (rear surface) side of the semiconductor layer 11.

The first field-effect transistor 21 has the first gate electrode 23 formed on the first surface S1 of the semiconductor layer 11 via the first gate insulating film 22 and the first source and drain regions 24, 25 formed on the semiconductor layer 11 at both sides of the first gate electrode 23.

Accordingly, the part of the semiconductor layer 11 between the first source and drain regions 24, 25 serves as a channel region of the first field-effect transistor 21.

The first gate insulating film 22 and the first gate electrode 23 are formed by the same materials as those have been described in the first embodiment.

Further, in the memory element part 12 of the semiconductor layer 11, a second field-effect transistor 31 having a second gate electrode 33 is formed on the second surface S2 (front surface) side opposite to the first surface S1.

The second field-effect transistor 31 has the second gate electrode 33 formed on the second surface S2 of the semiconductor layer 11 via the second gate insulating film 32 and second source and drain regions 34, 35 formed on the semiconductor layer 11 at both sides of the second gate electrode 33.

Accordingly, the part of the semiconductor layer 11 between the second source and drain regions 34, 35 serves as a channel region of the second field-effect transistor 31 in common with the first field-effect transistor 21. Further, the second source and drain regions 34, 35 are formed by a diffusion layer in common with the first source and drain regions 24, 25. Furthermore, the first gate electrode 23 and the second gate electrode 33 are formed in locations opposed with a first gate insulating film 22, the semiconductor layer 11, and a second gate insulating film 32 in between.

The second gate insulating film 32 and the second gate electrode 33 are formed by the same materials as those have been described in the first embodiment.

Note that the gate length of the second gate electrode 33 is formed according to a distance between the first source and drain regions 24, 25 at the second surface S2 side, and may be formed longer than the gate length of the first gate electrode 23, for example. It is obvious that the first gate electrode 23 and the second gate electrode 33 are formed to have the same gate length when the distances between the first source and drain regions 24, 25 (second source and drain regions 34, 35) at the first surface S1 side and at the second surface S2 side are equal.

The first field-effect transistor 21 and the second field-effect transistor 31 are fully-depleted field-effect transistors.

Further, the first gate electrode 23 and the second gate electrode 33 are electrically connected.

Moreover, in the logic element part 13 of the semiconductor layer 11, a third field-effect transistor 41 having a third gate electrode 43 is formed on the second surface S2 side of the semiconductor layer 11.

The third field-effect transistor 41 has the third gate electrode 43 formed on the second surface S2 of the semiconductor layer 11 via the third gate insulating film 42 and third source and drain regions 44, 45 formed on the semiconductor layer 11 at both sides of the third gate electrode 43.

Accordingly, the part of the semiconductor layer 11 between the third source and drain regions 44, 45 serves as a channel region of the third field-effect transistor 41.

The third gate insulating film 42 and the third gate electrode 43 are formed by the same methods as those have been described in the first embodiment.

The third field-effect transistor 41 is a partially-depleted field-effect transistor.

Here, there is no field-effect transistor of the logic element part 13 on the first surface S1 side of the semiconductor layer 11.

Further, on the first surface S1 of the semiconductor layer 11, a first insulating film 51 to cover the first field-effect transistor 21 is formed. The first insulating film 51 is formed to have a thickness of several hundreds of nanometers or more, for example, and its surface is planarized.

Furthermore, on the second surface S2 of the semiconductor layer 11, a second insulating film 61 to cover the second field-effect transistor 31 and the third field-effect transistor 41 is formed.

Moreover, a support substrate 100 is formed on the second insulating film 61.

Further, on the first insulating film 51, contact portions 52, 53 connected to the first source and drain regions 24, 25 and contact portions 54, 55 connected to the third source and drain regions 44, 45 are formed. Furthermore, wires 56 to 59 connected to the contact portions 52 to 55, respectively, are formed.

Though not shown, the wire of the Nth layer (N≧2) and the (N−1)th contact portion connecting the wire of the Nth layer and the wire of the (N−1)th layer are formed. That is, the wires are formed by multilayer wiring.

The contact portions 52 to 55 are formed by a metal material of titanium, titanium nitride, tantalum, tantalum nitride, tungsten, copper, or the like, for example.

Further, though not shown, the first gate electrode 23 and the second gate electrode 33 are electrically connected. An example of the configuration is the same as the configuration formed by inverting the configuration in the sectional view of FIG. 2 to 180 degrees.

In the semiconductor device 2, the first gate electrode 23 of the first field-effect transistor 21 and the second gate electrode 33 of the second field-effect transistor 31 are electrically connected, and thereby, the same potential is provided to the first gate electrode 23 and the second gate electrode 33. Accordingly, the potential in the common channel part to the first field-effect transistor 21 and the second field-effect transistor 31 can be stabilized and the intended performance can be realized.

Note that, in the drawing, the first field-effect transistor 21 and the second field-effect transistor 31 are shown, however, the memory element part 12 is formed by plural field-effect transistors. The first field-effect transistor 21 and the second field-effect transistor 31 are part of them.

In the semiconductor device 1, the semiconductor layer 11 is formed between the first insulating film 51 and the second insulating film 61, and the semiconductor layer 11 substantially has an SOI structure. The first field-effect transistor 21 and the second field-effect transistor 31 formed on the semiconductor layer 11 are fully-depleted field-effect transistors, and do not leave any non-depleted region in the semiconductor layer at operation. That is, the semiconductor layer 11 as the channel region is fully depleted.

Accordingly, the channel density can be made lower while the leak of the memory cell transistor is suppressed, and σVth as variance of threshold voltage is significantly reduced.

Further, the third field-effect transistor 41 formed in the logic element part 13 may be a partially-depleted single-gate field-effect transistor operating at a low voltage with low-load capacity.

Therefore, σVth of the first and second field-effect transistors 21, 31 of the memory element part 12 can be significantly reduced and the third field-effect transistor 41 of the logic element part 13 is a field-effect transistor operating at a low voltage with low-load capacity, and thereby, high-speed operation with low-power consumption can be realized.

The semiconductor device 2 may be applied to an SRAM as shown in the circuit diagram of FIG. 3 and the layout diagram of FIG. 4, for example.

One of the first gate electrode 23 of the first field-effect transistor 21 formed on the upper surface side of the semiconductor layer 11 and the second gate electrode 33 of the second field-effect transistor 31 formed on the lower surface side of the semiconductor layer 11 is provided at the inner side of the other in the planar layout. In the drawings, as an example, the second gate electrode 33 is provided at the inner side of the first gate electrode 23 in the planar layout. Even in consideration of misalignment of the first gate electrode 23 and the second gate electrode 33, the second gate electrode 33 is provided at the inner side of the first gate electrode 23 in the planar layout.

Further, in the sectional view of FIG. 5 along the A-A' line in FIG. 4, the configuration is the same as the configuration formed by inverting the configuration to 180 degrees. That is, the first gate electrode 23 and the second gate electrode 33 are electrically connected by the contact portion 16 formed through the element isolation region 14 formed in the semiconductor layer 11.

<3. Third Embodiment>

[Third Example of Configuration of Semiconductor Device]

Figure 7:
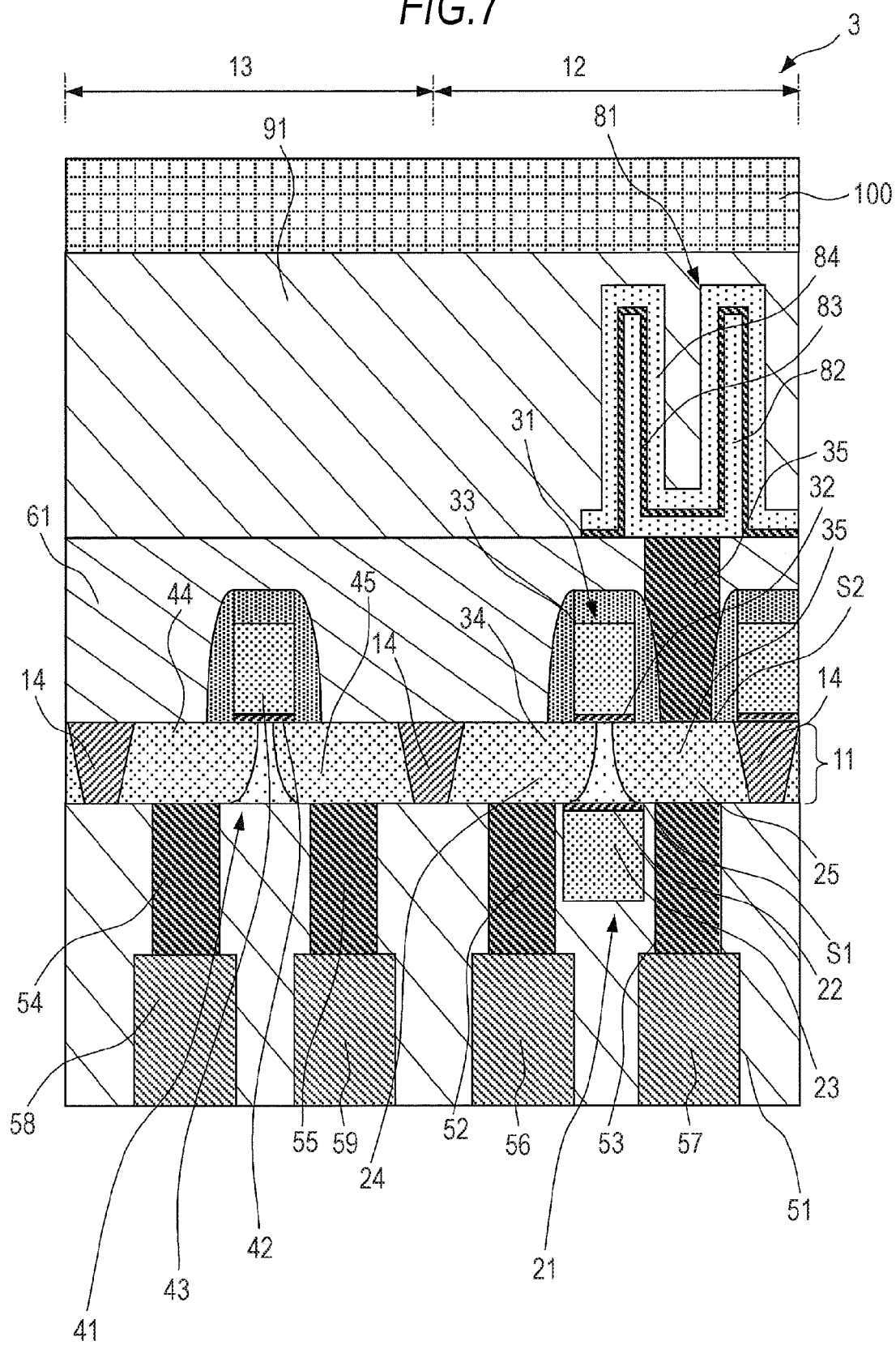
FIG. 7 is a schematic configuration sectional view showing a third example of a semiconductor device according to a third embodiment.

A third example of a configuration of a semiconductor device according to a third embodiment will be explained using a schematic configuration sectional view of FIG. 7. In FIG. 7, as an example, a transistor of a logic element circuit of a logic element part and an N-channel transistor of a DRAM cell as a memory element part are shown.

As shown in FIG. 7, in the semiconductor device 3, in the configuration of the semiconductor device 2 that has been described according to FIG. 6, a capacitor 81 of the DRAM connected to second source and drain regions 34, 35 via a contact portion 85 is formed above the second surface S2 side of a semiconductor layer 11.

That is, the semiconductor device includes the semiconductor layer 11, and element isolation regions 14 that isolate a memory element part 12 and a logic element part 13 are formed in the semiconductor layer 11.

In the memory element part 12 of the semiconductor layer 11, a first field-effect transistor 21 having a first gate electrode 23 is formed on the first surface S1 (rear surface) side of the semiconductor layer 11.

The first field-effect transistor 21 has the first gate electrode 23 formed on the first surface S1 of the semiconductor layer 11 via the first gate insulating film 22 and the first source and drain regions 24, 25 formed on the semiconductor layer 11 at both sides of the first gate electrode 23.

Further, in the memory element part 12 of the semiconductor layer 11, a second field-effect transistor 31 having a second gate electrode 33 is formed on the second surface S2 (front surface) side opposite to the first surface S1.

The second field-effect transistor 31 has the second gate electrode 33 formed on the second surface S2 of the semiconductor layer 11 via the second gate insulating film 32 and second source and drain regions 34, 35 formed on the semiconductor layer 11 at both sides of the second gate electrode 33.

The second source and drain regions 34, 35 are formed by a diffusion layer in common with the first source and drain regions 24, 25. Furthermore, the first gate electrode 23 and the second gate electrode 33 are formed in locations opposed with a first gate insulating film 22, the semiconductor layer 11, and a second gate insulating film 32 in between.

Further, though not shown, the first gate electrode 23 and the second gate electrode 33 are electrically connected.

Moreover, in the logic element part 13 of the semiconductor layer 11, a third field-effect transistor 41 having a third gate electrode 43 is formed on the second surface S2 side of the semiconductor layer 11.

The third field-effect transistor 41 has the third gate electrode 43 formed on the second surface S2 of the semiconductor layer 11 via the third gate insulating film 42 and third source and drain regions 44, 45 formed on the semiconductor layer 11 at both sides of the third gate electrode 43.

The third field-effect transistor 41 is a partially-depleted field-effect transistor.

Further, on the first surface S1 of the semiconductor layer 11, a first insulating film 51 to cover the first field-effect transistor 21 is formed.

Furthermore, on the second surface S2 of the semiconductor layer 11, a second insulating film 61 to cover the second field-effect transistor 31 and the third field-effect transistor 41 is formed.

Further, on the first insulating film 51, contact portions 52, 53 connected to the second source and drain regions 34, 35, contact portions 54, 55 connected to the third source and drain regions 44, 45 are formed, and wires 56 to 59 connected to the contact portions 52 to 55, respectively, are formed.

On the second insulating film 61, the DRAM capacitor 81 is formed. The capacitor 81 includes a first electrode 81 and a second electrode 84 formed on the surface of the first electrode 82 via a capacitor insulating film 83.

Further, for example, the second source and drain region 25 and the first electrode 82 are electrically connected by the contact portion 85 formed through the second insulating film 61.

Furthermore, a third insulating film 91 to cover the capacitor 81 is formed on the second insulating film 61, and a support substrate 100 is formed on the third insulating film 91.

In the above description, the capacitor 81 has been adopted as a memory element of the DRAM, however, for example, a magnetoresistance effect element such as a TMR element or a GMR element, or a magnetic memory element such as a magnetic spin bubble memory element may be used.

In the semiconductor device 3, the advantages as those in the semiconductor device 2 that have been described in the second embodiment can be obtained.

<4. Fourth Embodiment>

[First Example of Manufacturing Method of Semiconductor Device]

Figure 8:
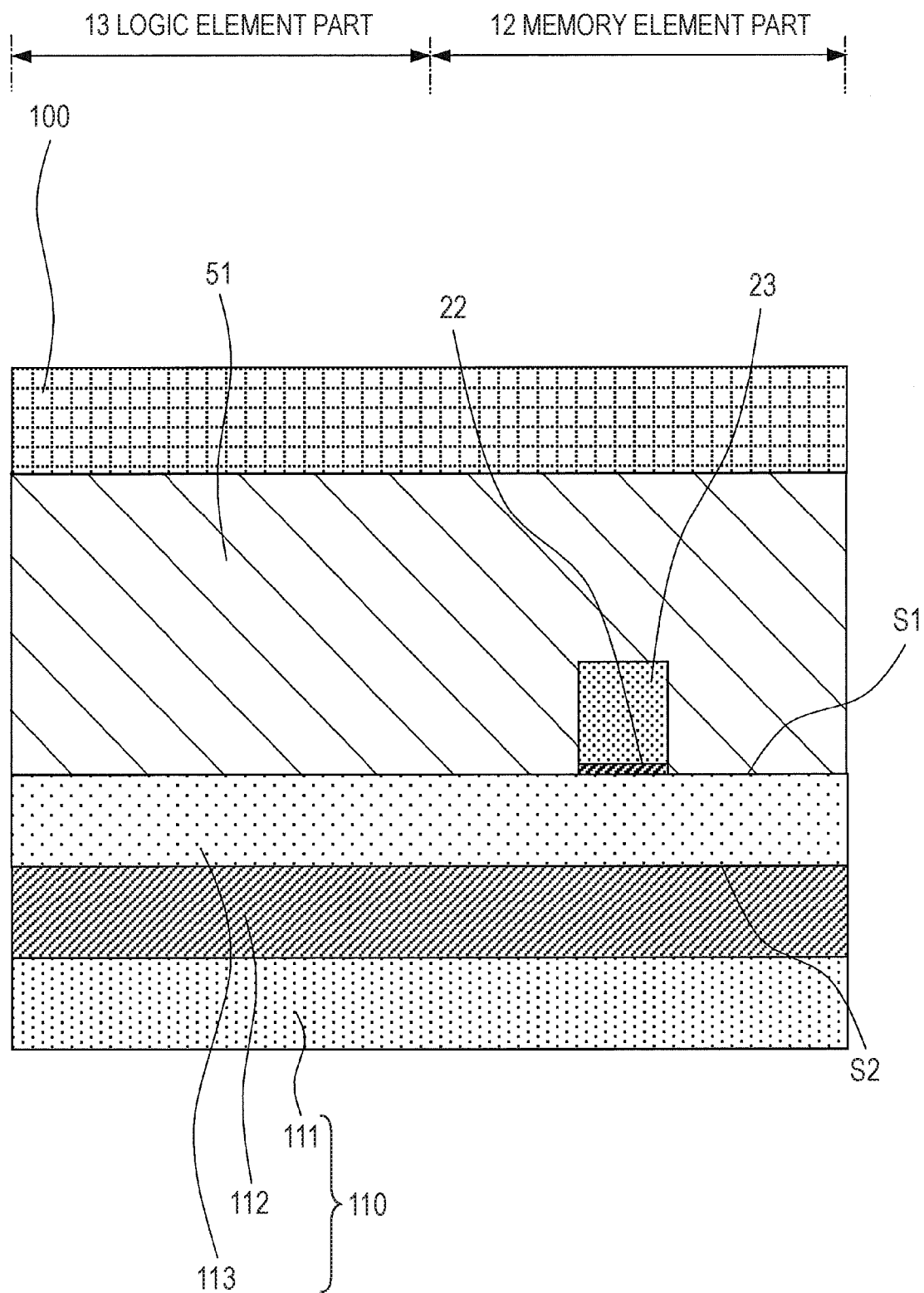
FIG. 8 is a manufacturing process sectional view showing a first example of a manufacturing method of a semiconductor device according to a fourth embodiment.
Figure 9:
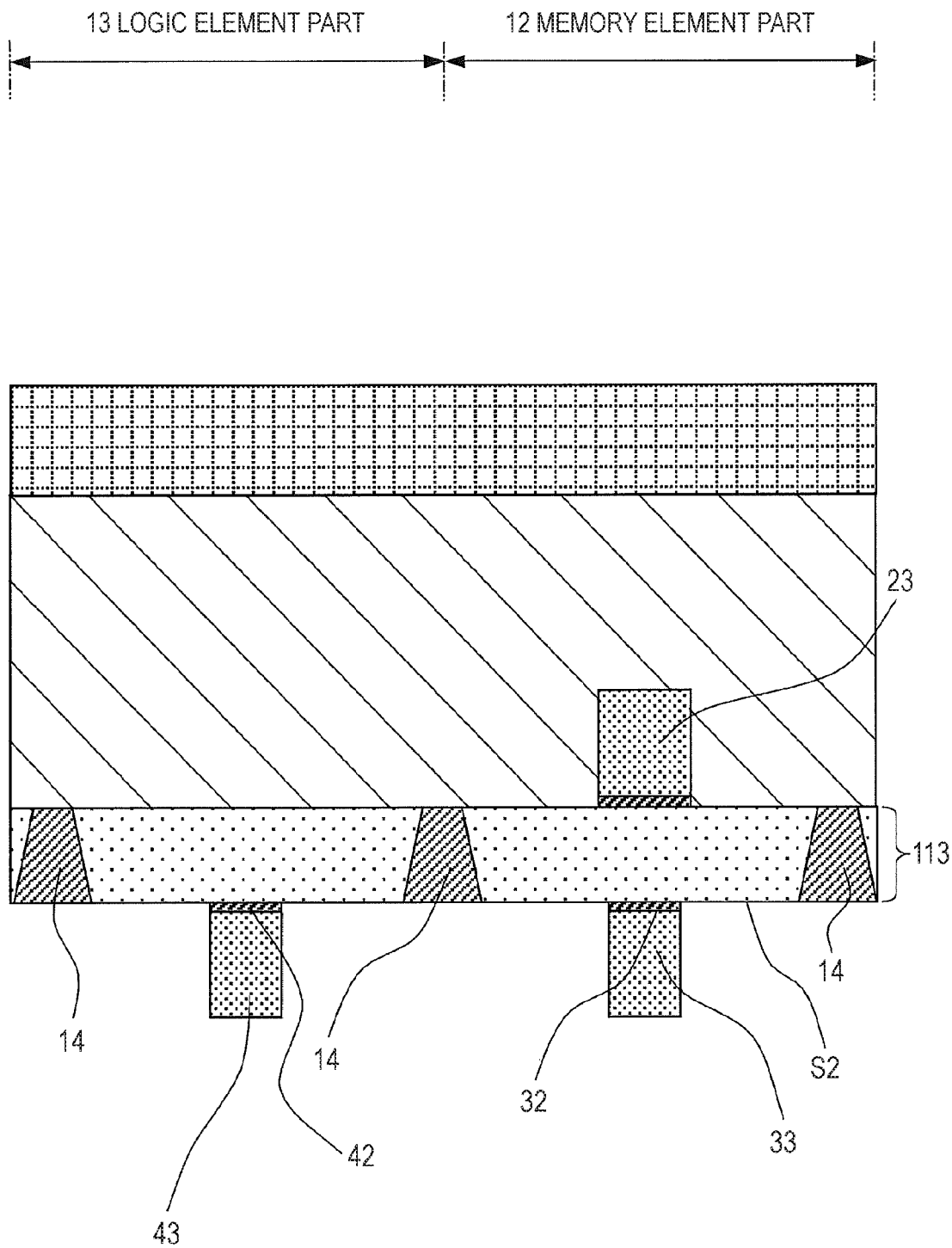
FIG. 9 is a manufacturing process sectional view showing the first example of the manufacturing method of a semiconductor device according to the fourth embodiment.
Figure 10:
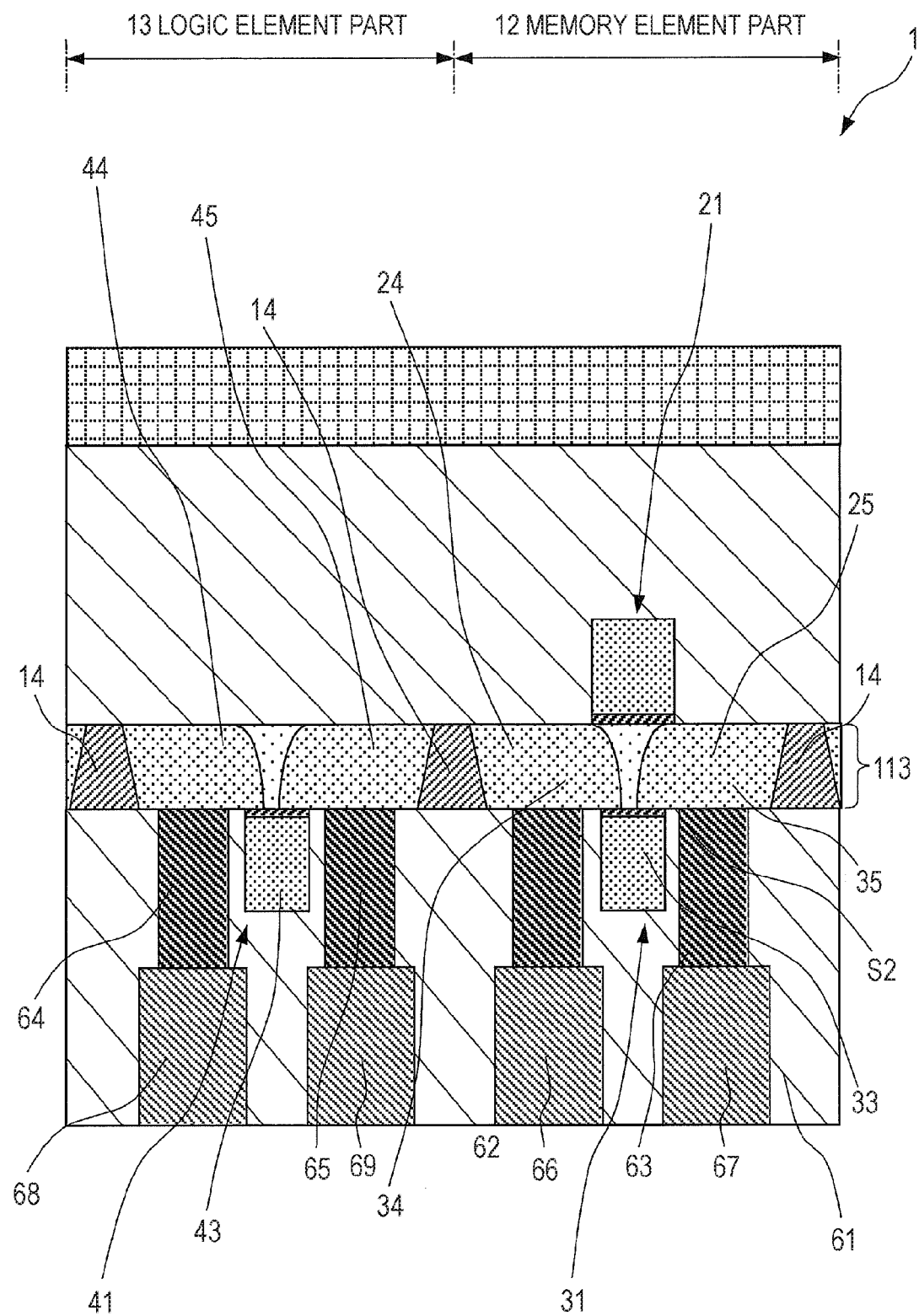
FIG. 10 is a manufacturing process sectional view showing the first example of the manufacturing method of a semiconductor device according to the fourth embodiment.

A first example of a manufacturing method of a semiconductor device according to a fourth embodiment will be explained using manufacturing process sectional views of FIGS. 8 to 10. In FIGS. 8 to 10, as an example, processes of manufacturing a transistor of a logic element circuit of a logic element part and an N-channel transistor of an SRAM cell as a memory element part are shown.

As shown in FIG. 8, an SOI substrate 110 in which a substrate 111, an insulator layer 112, a silicon layer 113 (corresponding to the semiconductor layer 11 in the first embodiment) are stacked is prepared.

Then, a first gate electrode 23 of a first field-effect transistor is formed on the surface to be a memory element part 12 of the silicon layer 113 (first surface S1) via a first gate insulating film 22.

For the substrate 111, a semiconductor substrate having conductivity is used. Further, the insulator layer 112 is formed by a buried silicon oxide layer (so-called a BOX layer).

For the first gate insulating film 22, for example, a thermally oxidized nitride film formed by thermal oxidation, plasma oxidation, and plasma nitriding. Or, the film is formed by a so-called high-dielectric (High-K) film expressed by a chemical formula of $HfO_2$, HfSiON, $ZrO_2$, or ZrSiON formed by metalorganic chemical vapor deposition (MD-CVD), atomic layer deposition (ALD), or the like. Or, the film is formed by a compound film of a thermally oxidized nitride film and the high-dielectric film.

Further, the first gate electrode 23 is formed by titanium nitride, tantalum carbide, tungsten, or polysilicon, for example. The formation method is etching using a resist mask, for example.

On the front surface (first surface S1), the first field-effect transistor 21 of the memory element part 12 is provided, however, there is no field-effect transistor of a logic element part 13 (logic part).

Then, a first insulating film 51 to cover the first gate electrode 23 is formed on the surface of the silicon layer 113, and further, a support substrate 100 is formed on the first insulating film 51.

The first insulating film 51 is formed by a silicon oxide film, for example, and formed to have a thickness of several hundreds of nanometers or more, for example. Then, the surface is planarized by chemical mechanical polishing (CMP), for example. Alternatively, the film may be formed by an organic insulating film.

For the support substrate 100, a semiconductor substrate or a resin substrate may be used.

Then, the substrate 111 and the insulator layer 112 are removed for exposure of the rear surface (second surface S2) of the silicon layer 113. Then, the entire rear surface of the silicon layer 113 is exposed.

In the drawing, the state immediately before the removal of the substrate 111 and the insulator layer 112 is shown.

Then, as shown in FIG. 9, element isolation regions 14 that isolate the memory element part 12 and the logic element part 13 are formed in the silicon layer 113. The element isolation region 14 is formed to have an STI (Shallow Trench Isolation) structure, for example. That is, the region is formed by forming an element isolation groove in the silicon layer 113 and filling the element isolation groove with silicon oxide, for example.

Then, in a location on the rear surface (second surface S2) to be the memory element part 12 of the silicon layer 113 facing the first gate electrode 23, a second gate electrode 33 of a second field-effect transistor is formed via a second gate insulating film 32. At the same time, on the rear surface (second surface S2) to the logic element part 13 of the silicon layer 113, a third gate electrode 43 of a third field-effect transistor is formed via a third gate insulating film 42.

The second gate insulating film 32 and the third gate insulating film 42 are formed by the same materials in the same manner as those of the first gate insulating film 22. Further, the second gate electrode 33 and the third gate electrode 43 are formed by the same materials in the same manner as those of the first gate electrode 23.

Then, as shown in FIG. 10, on the silicon layer 113 at both sides of the second gate electrode 33, second source and drain regions 34, 35 of the second field-effect transistor 31 are formed. The second source and drain regions 34, 35 are source and drain regions in common with first source and drain regions 24, 25 of the first field-effect transistor 21. At the same time, on the silicon layer 113 at both sides of the third gate electrode 43, third source and drain regions 44, 45 of the third field-effect transistor 41 are formed.

The second source and drain regions 34, 35 are formed on the silicon layer 113 by ion implantation using the second gate electrode 33 and the element isolation region 14 as a mask. Similarly, the third source and drain regions 44, 45 are formed on the silicon layer 113 by ion implantation using the third gate electrode 43 and the element isolation region 14 as a mask.

Note that, the second source and drain regions 34, 35 and the third source and drain regions 44, 45 can be formed when they are formed in the same specifications, however, when they are formed in the different specifications, they are separately formed using resist masks. That is, a resist mask is formed for one of them in different specifications, and source and drain regions are formed for the other one by ion implantation, for example.

Then, after the resist mask is removed, a resist mask is formed for the other one of them in different specifications, and source and drain regions are formed for the one by ion implantation, for example.

Further, in the case where plural field-effect transistors are formed on the same one surface of the memory element part 12, for example, when an n-channel field-effect transistor and a p-channel field-effect transistor are formed, they are separately formed using resist masks. That is, a resist mask is formed at the p-channel field-effect transistor side, and source and drain regions at the n-channel field-effect transistor side are formed by ion implantation, for example.

Then, after the resist mask is removed, a resist mask is formed at the n-channel field-effect transistor side, and source and drain regions at the p-channel field-effect transistor side are formed by ion implantation, for example. It is obvious that the p-channel field-effect transistor side may be formed first, and then, the n-channel field-effect transistor side may be formed.

Further, in the case where plural field-effect transistors are formed on the same one surface of the logic element part 13, for example, when an n-channel field-effect transistor and a p-channel field-effect transistor are formed, they are separately formed using resist masks.

Figure 2:
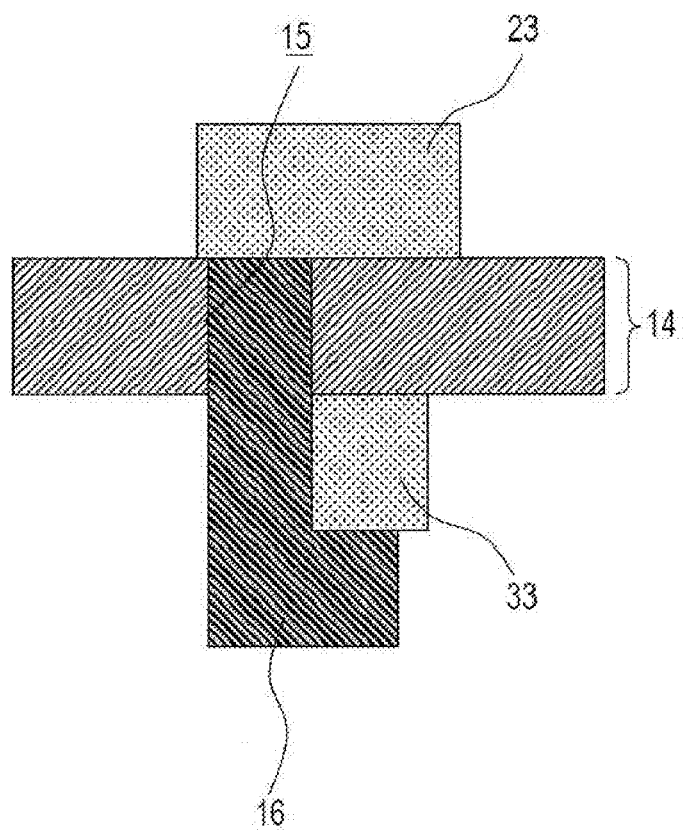
FIG. 2 is a schematic configuration sectional view showing a contact portion between first and second gate electrodes.

Furthermore, though not shown, the same contact portion 16 as that formed by inverting the configuration of FIG. 2 to 180 degrees, for example, for connecting the first gate electrode 23 and the second gate electrode 33 is formed in the element isolation region 14. Therefore, the first gate electrode 23 and the second gate electrode 33 are formed to be led out to the element isolation region 14 side in the same direction. The contact portion 16 is formed by a metal material of titanium, titanium nitride, tantalum, tantalum nitride, tungsten, copper, or the like, for example.

Then, on the rear surface (second surface S2) of the silicon layer 113, a second insulating film 61 to cover the second gate electrode 33 and the third gate electrode 43 is formed. The second insulating film 61 is formed by a silicon oxide film, for example, or may be formed by an organic insulating film.

Furthermore, by a typical wiring formation technology, on the second insulating film 61, contact portions 62, 63 connected to the second source and drain regions 34, 35 and contact portions 64, 65 connected to the third source and drain regions 44, 45 are formed. Furthermore, wires 66 to 69 connected to the contact portions 62 to 65 are formed.

Though not shown, the wire of the Nth layer (N≧2) and the (N−1)th contact portion connecting the wire of the Nth layer and the wire of the (N−1)th layer are formed. That is, multilayer wiring is formed.

The contact portions 62 to 65 are formed by a metal material of titanium, titanium nitride, tantalum, tantalum nitride, tungsten, copper, or the like, for example.

In this manner, the first field-effect transistor 21 and the second field-effect transistor 31 are formed as fully-depleted field-effect transistors, and the third field-effect transistor 41 is formed as a partially-depleted field-effect transistor.

In the manufacturing method of the semiconductor device 1, the first insulating film 51 and the second insulating film 61 are formed at both sides of the silicon layer 113, and the silicon layer 113 substantially has an SOI structure. The first field-effect transistor 21 and the second field-effect transistor 31 formed on the silicon layer 113 are formed as fully-depleted field-effect transistors, and do not leave any non-depleted region in the silicon layer at operation. That is, the silicon layer 113 as the channel region is fully depleted.

Accordingly, the channel density can be made lower while the leak of the memory cell transistor is suppressed, and σVth as variance of threshold voltage is significantly reduced.

Further, the third field-effect transistor 41 formed in the logic element part 13 may be a partially-depleted single-gate field-effect transistor operating at a low voltage with low-load capacity.

Therefore, σVth of the first and second field-effect transistors 21, 31 of the memory element part 12 can be significantly reduced and the third field-effect transistor 41 of the logic element part 13 is a field-effect transistor operating at a low voltage with low-load capacity, and thereby, high-speed operation with low-power consumption can be realized.

<5. Fifth Embodiment>

[Second Example of Manufacturing Method of Semiconductor Device]

A second example of a manufacturing method of a semiconductor device according to a fifth embodiment will be explained using manufacturing process sectional views of FIGS. 11 and 12.

Figure 11:
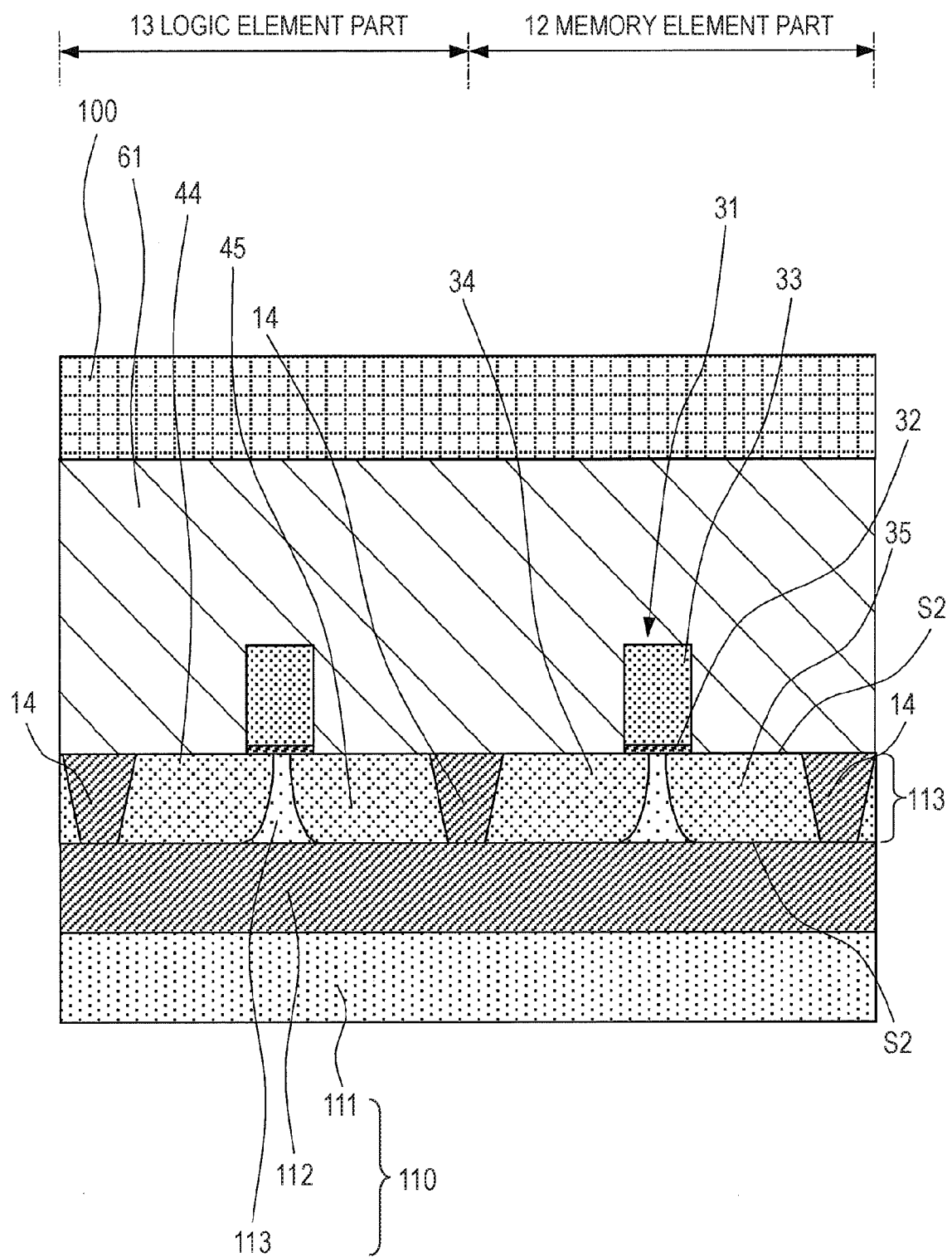
FIG. 11 is a manufacturing process sectional view showing a second example of a manufacturing method of a semiconductor device according to a fifth embodiment.

As shown in FIG. 11, an SOI substrate 110 in which a substrate 111, an insulator layer 112, a silicon layer 113 (corresponding to the semiconductor layer 11 in the first embodiment) are stacked is prepared.

Then, element isolation regions 14 that isolate the memory element part 12 and the logic element part 13 are formed in the silicon layer 113. The element isolation region 14 is formed to have an STI structure as is the case of the first example of the manufacturing method.

Then, on the front surface (second surface S2) to be the memory element part 12 of the silicon layer 113, a second gate electrode 33 is formed via a second gate insulating film 32. At the same time, on the front surface (second surface S2) to be the logic element part 13 of the silicon layer 113, a third gate electrode 43 is formed via a third gate insulating film 42.

The second gate insulating film 32 and the third gate insulating film 42 are formed by the same materials in the same manner as those of the first gate insulating film 22. Further, the second gate electrode 33 and the third gate electrode 43 are formed by the same materials in the same manner as those of the first gate electrode 23.

Then, on the silicon layer 113 at both sides of the second gate electrode 33, second source and drain regions 34, 35 of the second field-effect transistor 31 are formed. The second source and drain regions 34, 35 are source and drain regions in common with first source and drain regions 24, 25 of the first field-effect transistor, which will be formed later. At the same time, on the silicon layer 113 at both sides of the third gate electrode 43, third source and drain regions 44, 45 of the third field-effect transistor 41 are formed.

The formation methods of the respective source and drain regions are the same as those in the first example of the manufacturing method.

Then, on the front surface (second surface S2) of the silicon layer 113, a second insulating film 61 to cover the second gate electrode 33 and the third gate electrode 34 is formed, and its surface is planarized. The second insulating film 61 is formed by a silicon oxide film to have a thickness of several hundreds of nanomotors, for example, or may be formed by an organic insulating film. The planarization is performed by chemical mechanical polishing, for example.

Furthermore, a support substrate 100 is formed on the first insulating film 51. For the support substrate 100, a semiconductor substrate or a resin substrate may be used.

Then, the substrate 111 and the insulator layer 112 are removed for exposure of the rear surface (second surface S2) of the silicon layer 113. Thereby, the entire rear surface of the silicon layer 113 is exposed.

In the drawing, the state immediately before the removal of the substrate 111 and the insulating film 112 is shown.

Figure 12:
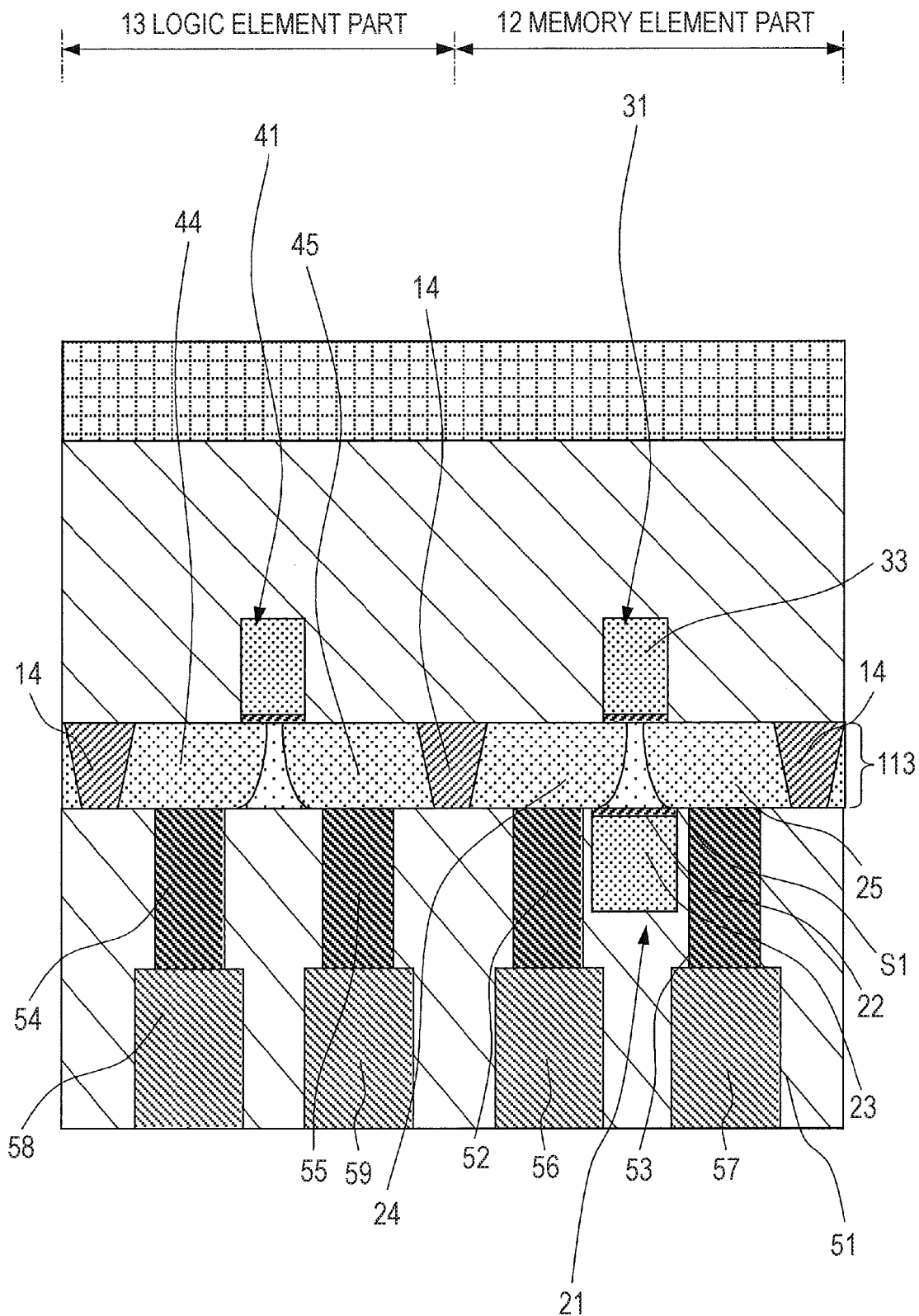
FIG. 12 is a manufacturing process sectional view showing the second example of the manufacturing method of a semiconductor device according to the fifth embodiment.

Then, as shown in FIG. 12, in a location on the rear surface (first surface S1) to be the memory element part 12 of the silicon layer 113 facing the second gate electrode 33, a first gate electrode 23 of a first field-effect transistor 21 is formed via a first gate insulating film 22. The formation method is the same as that in the first example of the manufacturing method.

Furthermore, though not shown, a contact portion connecting the first gate electrode 23 and the second gate electrode 33 is formed in the element isolation region 14. Therefore, the first gate electrode 23 and the second gate electrode 33 are formed to be led out to the element isolation region 14 side in the same direction.

Then, on the rear surface (first surface S1) of the silicon layer 113, a first insulating film 51 to cover the first gate electrode 23 is formed. The first insulating film 51 is formed by a silicon oxide film, for example, or may be formed by an organic insulating film.

Furthermore, by a typical wiring formation technology, on the first insulating film 51, contact portions 52, 53 connected to the first source and drain regions 24, 25 and contact portions 54, 55 connected to the third source and drain regions 44, 45 are formed. Furthermore, wires 56 to 59 connected to the contact portions 52 to 55 are formed.

Though not shown, the wire of the Nth layer (N≧2) and the (N−1)th contact portion connecting the wire of the Nth layer and the wire of the (N−1)th layer are formed. That is, multilayer wiring is formed.

The contact portions 52 to 55 are formed by a metal material of titanium, titanium nitride, tantalum, tantalum nitride, tungsten, copper, or the like, for example.

In this manner, the first field-effect transistor 21 and the second field-effect transistor 31 are formed as fully-depleted field-effect transistors, and the third field-effect transistor 41 is formed as a partially-depleted field-effect transistor.

In the manufacturing method of the semiconductor device 2, there are same advantages as those of the manufacturing method of the semiconductor device 1.

<6. Sixth Embodiment>

[Third Example of Manufacturing Method of Semiconductor Device]

A third example of a manufacturing method of a semiconductor device according to a sixth embodiment will be explained using manufacturing process sectional views of FIGS. 13 to 15.

Figure 13:
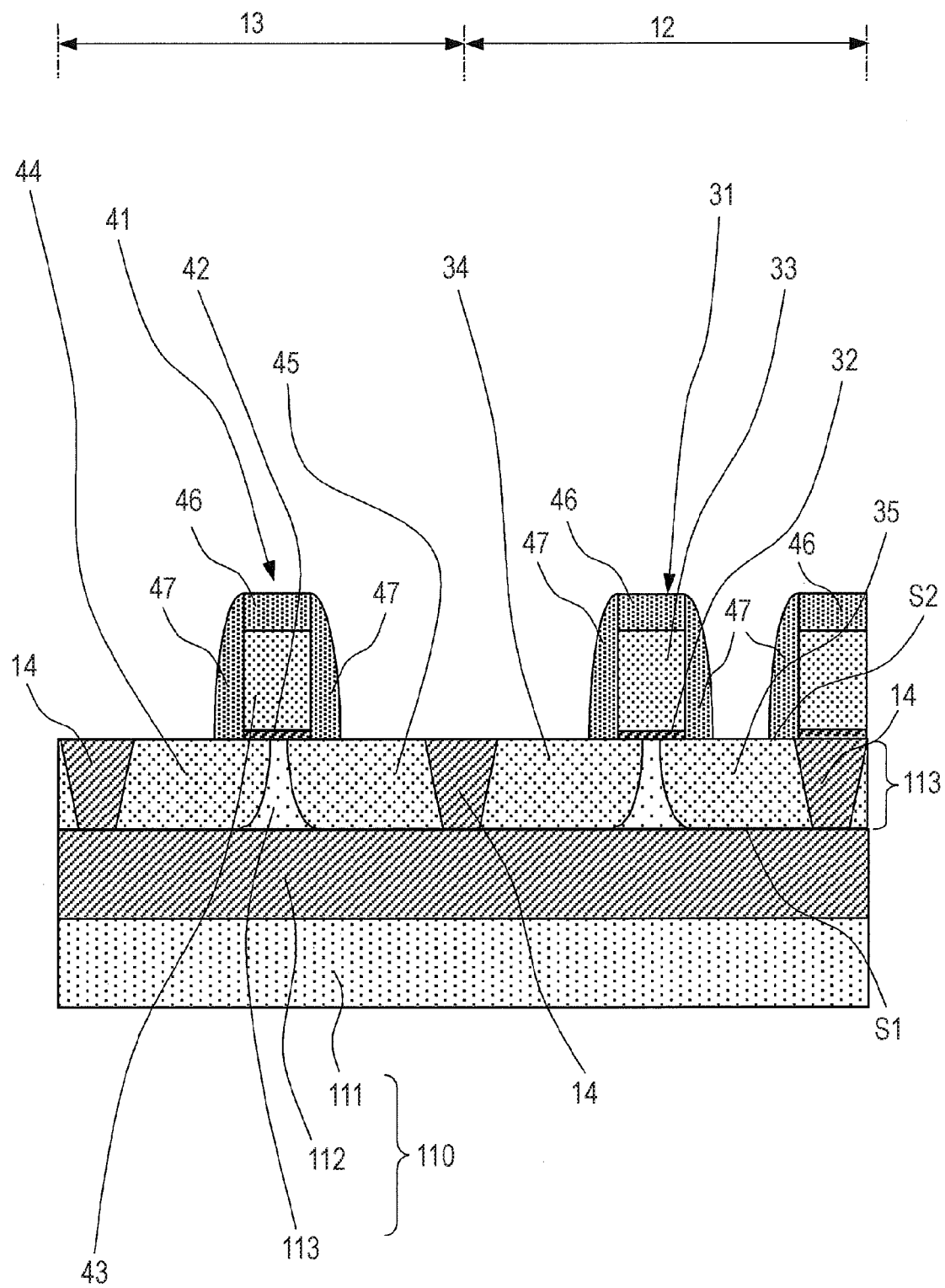
FIG. 13 is a manufacturing process sectional view showing a third example of a manufacturing method of a semiconductor device according to a sixth embodiment.

As shown in FIG. 13, an SOI substrate 110 in which a substrate 111, an insulator layer 112, a silicon layer 113 (corresponding to the semiconductor layer 11 in the first embodiment) are stacked is prepared.

Then, element isolation regions 14 that isolate the memory element part 12 and the logic element part 13 are formed in the silicon layer 113. The element isolation region 14 is formed to have an STI structure as is the case of the first example of the manufacturing method.

Then, on the front surface (second surface S2) to be the memory element part 12 of the silicon layer 113, a second gate electrode 33 of a second field-effect transistor 31 is formed via a second gate insulating film 32. At the same time, on the front surface (second surface S2) to be the logic element part 13 of the silicon layer 113, a third gate electrode 43 of a third field-effect transistor 41 is formed via a third gate insulating film 42.

The second gate insulating film 32 and the third gate insulating film 42 are formed by the same materials in the same manner as those of the first gate insulating film 22. Further, the second gate electrode 33 and the third gate electrode 43 are formed by the same materials in the same manner as those of the first gate electrode 23.

Then, on the silicon layer 113 at both sides of the second gate electrode 33, second source and drain regions 34, 35 of the second field-effect transistor 31 are formed. The second source and drain regions 34, 35 are source and drain regions in common with first source and drain regions 24, 25 of the first field-effect transistor, which will be formed later. At the same time, on the silicon layer 113 at both sides of the third gate electrode 43, third source and drain regions 44, 45 of the third field-effect transistor 41 are formed.

The formation methods of the respective source and drain regions are the same as those in the first example of the manufacturing method.

Further, the third source and drain regions 44, 45 of the third field-effect transistor 41 formed in the logic element part 13 may have LDD structures.

In this case, when the third gate electrode 43 is formed, an insulating film 46 is formed on the third gate electrode 43 in advance. At the same time, the same insulating film 46 is also formed on the second gate electrode 33. Then, using the insulating film 46 and the third gate electrode 43 as a mask and using a resist film that only opens in the logic element part 13 (not shown), an LDD region (not shown) is formed by ion implantation, for example. Then, the resist film is removed.

Then, a side wall insulating film 47 is formed on the side wall of the third gate electrode 43. At the same time, a side wall insulating film 47 is also formed on the side wall of the second gate electrode 33.

Then, using the second and third gate electrode 33, 43 and the side wall insulating films 47, 47 as masks, the third source and drain regions 44, 45 and the second source and drain regions 34, 35 may be formed by ion implantation, for example.

In the drawing, another second gate electrode 33 formed adjacent to the second gate electrode 33 of the memory element part 12 is partially formed on the element isolation region 14 in the layout. The part is shown in the drawing.

Figure 14:
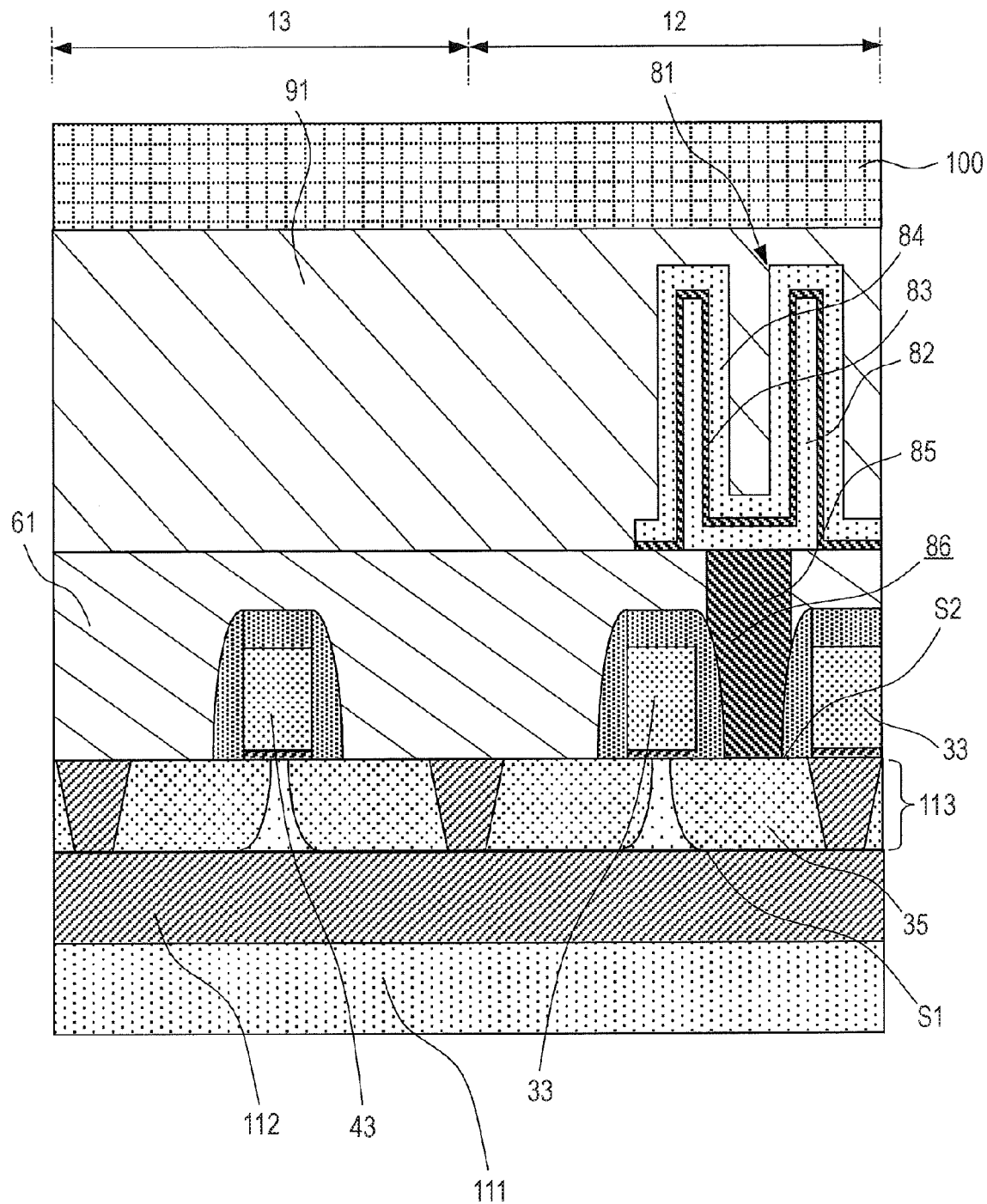
FIG. 14 is a manufacturing process sectional view showing the third example of the manufacturing method of a semiconductor device according to the sixth embodiment.

Then, as shown in FIG. 14, on the front surface (second surface S2) of the silicon layer 113, a second insulating film 61 to cover the second gate electrode 33 and the third gate electrode 43 is formed, and its surface is planarized. The second insulating film 61 is formed by a silicon oxide film, for example, or may be formed by an organic insulating film. The planarization is performed by chemical mechanical polishing, for example.

Then, a contact hole 86 reaching the second source and drain region 35 is formed in the second insulating film 61.

Subsequently, a conductor film is formed on the second insulating film 61 for filling the contact hole 86.

Then, the excessive conductor film on the second insulating film 61 is removed and a contact portion (memory node contact) 85 of the conductor film is formed within the contact hole 86. The conductor film is formed by a metal material of titanium, titanium nitride, tantalum, tantalum nitride, tungsten, copper, or the like, for example.

Next, a capacitor 81 of DRAM is formed on the second insulating film 61.

As below, one example of forming the capacitor 81 will be explained.

First, on the second insulating film 61, after an insulating film of a material different from that of the second insulating film 61 is formed, an opening portion (not shown) is formed in a region where the capacitor 81 is to be formed. Subsequently, a conductor film (not shown) to be the first electrode of the capacitor 81 is formed on the insulating film containing the inner surface of the opening portion. The conductor film is formed by a conductive metal compound of titanium nitride, tantalum nitride, or the like, or a metal of ruthenium, tungsten, or the like, for example. Then, the conductor film formed on the insulating film is removed by chemical mechanical polishing, for example, and the conductor film is left only within the opening portion. Then, the insulating film is removed, and thereby, a cylindrical first electrode (memory node electrode) 82 of the conductor film is formed.

Then, a capacitor insulating film 83 is formed to cover the surface of the first electrode 82. The capacitor insulating film 83 is formed by a high-dielectric film of silicon nitride, aluminum oxide ($Al_2O_3$), hafnium oxide ($HfO_2$), titanium oxide ($TiO_2$), strontium titanate ($SrTiO_3$), barium strontium titanate (($Ba,Sr)TiO_3$), or the like or a composite film of them, for example.

Further, a second electrode 84 (plate electrode) is formed. The second electrode 84 is formed by a conductive metal compound of titanium nitride, tantalum nitride, or the like, or a metal of ruthenium, tungsten, or the like, for example.

Then, the second electrode 84 and the capacitor insulating film 83 are patterned by etching using resist masks (not shown). Thereby, the capacitor 81 including the first electrode 82, the capacitor insulating film 83 covering the surface of the first electrode 82, and the second electrode 84 covering the surface of the capacitor insulating film 83 is completed.

Next, a third insulating film 91 to cover the capacitor 81 is formed. The third insulating film 91 is formed by a silicon oxide film, for example, and formed to have a thickness of several hundreds of nanometers or more, for example. Then, the surface of the third insulating film 91 is planarized by chemical mechanical polishing, for example.

Further, a support substrate 100 is formed on the third insulating film 91. For the support substrate 100, a semiconductor substrate or a resin substrate may be used. For example, the support substrate 100 is bonded to the surface of the third insulating film 91.

Then, the substrate 111 and the insulating film 112 are removed for exposure of the rear surface (second surface S2) of the silicon layer 113. Then, the entire rear surface of the silicon layer 113 is exposed.

In the drawing, the state immediately before the removal of the substrate 111 and the insulating film 112 is shown.

Figure 15:
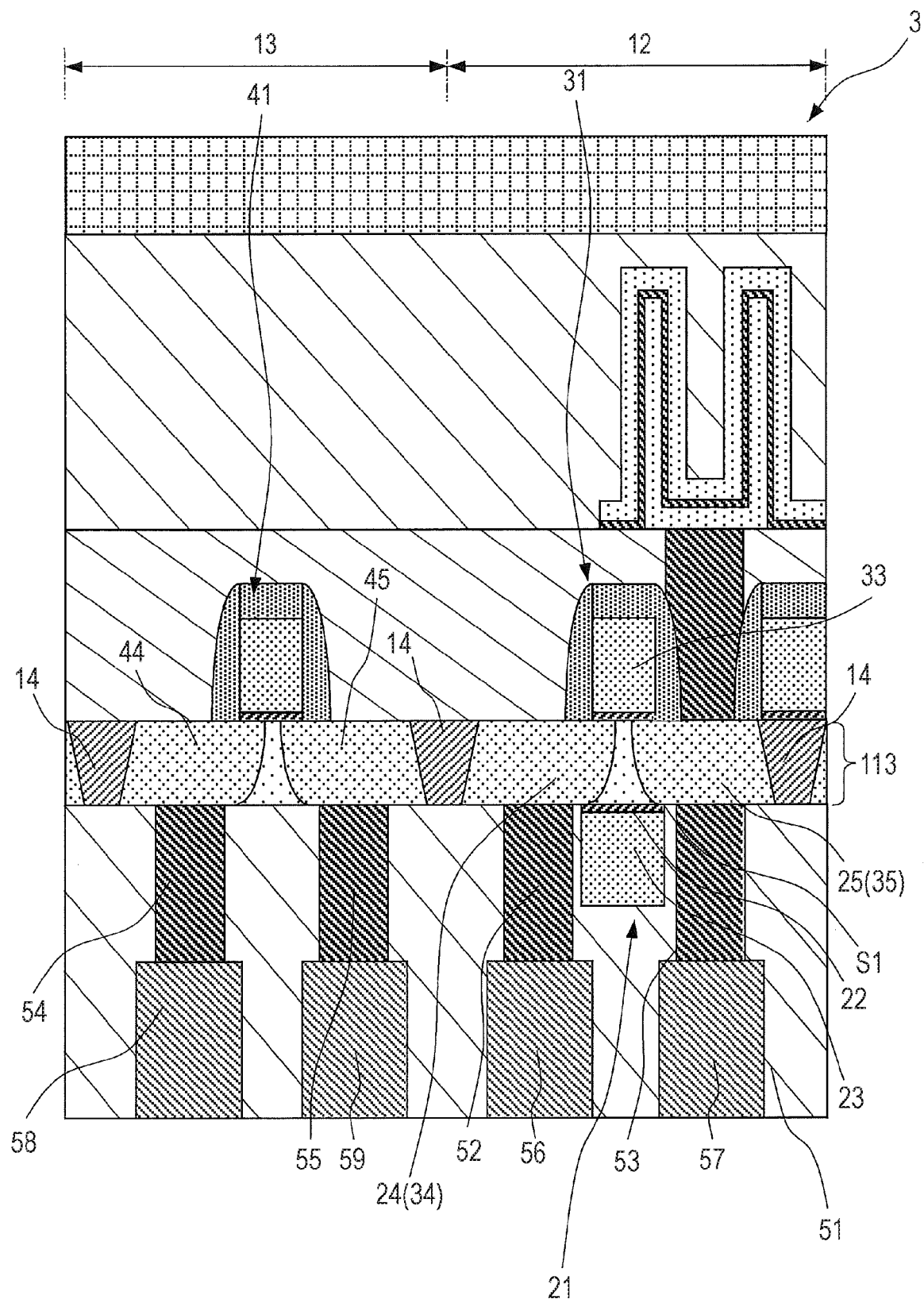
FIG. 15 is a manufacturing process sectional view showing the third example of the manufacturing method of a semiconductor device according to the sixth embodiment.

Then, as shown in FIG. 15, in a location on the rear surface (first surface S1) to be the memory element part 12 of the silicon layer 113 facing the second gate electrode 33, a first gate electrode 23 of a first field-effect transistor 21 is formed via a first gate insulating film 22. The formation method is the same as that in the first example of the manufacturing method.

Furthermore, though not shown, a contact portion connecting the first gate electrode 23 and the second gate electrode 33 is formed in the element isolation region 14. Therefore, the first gate electrode 23 and the second gate electrode 33 are formed to be led out to the element isolation region 14 side in the same direction.

Further, the first gate electrode 23 is formed with the second gate electrode 33 at the inner side thereof in the planar layout.

Then, on the rear surface (first surface S1) of the silicon layer 113, a first insulating film 51 to cover the first gate electrode 23 is formed. The first insulating film 51 is formed by a silicon oxide film, for example, or may be formed by an organic insulating film.

Furthermore, by a typical wiring formation technology, on the first insulating film 51, contact portions 52, 53 connected to the first source and drain regions 24, 25 in common with the second source and drain regions 34, 35 that have been described according to FIG. 13 and contact portions 54, 55 connected to the third source and drain regions 44, 45 are formed.

Furthermore, wires 56 to 59 connected to the contact portions 52 to 55 are formed.

Then, though not shown, the wire of the Nth layer (N≧2) and the (N−1)th contact portion connecting the wire of the Nth layer and the wire of the (N−1)th layer are formed. That is, multilayer wiring is formed.

The contact portions 52 to 55 are formed by a metal material of titanium, titanium nitride, tantalum, tantalum nitride, tungsten, copper, or the like, for example.

In this manner, the first field-effect transistor 21 and the second field-effect transistor 31 are formed as fully-depleted field-effect transistors, and the third field-effect transistor 41 is formed as a partially-depleted field-effect transistor.

In the semiconductor device 3, the memory element part 12 is formed by a DRAM. Accordingly, the second field-effect transistor 31 is a DRAM access transistor.

In the above description, the capacitor 81 has been adopted as a memory element of the DRAM, however, for example, a magnetoresistance effect element such as a TMR element or a GMR element, or a magnetic memory element such as a magnetic spin bubble memory element may be formed.

In the manufacturing method of the semiconductor device 3, there are same advantages as those of the manufacturing method of the semiconductor device 1.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A semiconductor device comprising:
    a semiconductor layer;
    an element isolation region formed in the semiconductor layer for separation of the semiconductor layer into a memory element part and a logic element part;
    a first field-effect transistor formed in the memory element part of the semiconductor layer and having a first gate electrode on a first surface side of the semiconductor layer;
    a second field-effect transistor formed in the memory element part of the semiconductor layer and having a second gate electrode on a second surface side opposite to the first surface and a source and drain region in common with a source and drain region of the first field-effect transistor;
    a third field-effect transistor formed in the logic element part of the semiconductor layer and having a third gate electrode on the second surface side;
    a first insulating film formed on the semiconductor layer to cover the first field-effect transistor; and
    a second insulating film formed on the semiconductor layer to cover the second field-effect transistor and the third field-effect transistor,
    wherein the first field-effect transistor and the second field-effect transistor are fully-depleted field-effect transistors, and
    the first gate electrode and the second gate electrode are electrically connected;
    wherein the first gate electrode and the second gate electrode are electrically connected by a contact portion formed through the element isolation region.

2. The semiconductor device according to claim 1, wherein the first field-effect transistor has
    the first gate electrode formed on the first surface of the semiconductor layer via a first gate insulating film, and
    a first source and drain region formed in the semiconductor layer at both sides of the first gate electrode,
    the second field-effect transistor has
    the second gate electrode formed on the second surface of the semiconductor layer via a second gate insulating film, and
    a second source and drain region formed in the semiconductor layer at both sides of the second gate electrode,
    the third field-effect transistor has
    the third gate electrode formed on the second surface of the semiconductor layer via a third gate insulating film, and
    a third source and drain region formed in the semiconductor layer at both sides of the third gate electrode,
    the first gate electrode and the second gate electrode are formed in opposed locations, and
    the first source and drain region and the second source and drain region are formed by a common source and drain region.

3. The semiconductor device according to claim 2, wherein a memory element is connected to the first source and drain region.

4. The semiconductor device according to claim 1, wherein the memory element part includes plural field-effect transistors, and part of the transistors are the first field-effect transistor and the second field-effect transistor.

5. The semiconductor device according to claim 1, wherein the third field-effect transistor is a partially-depleted field-effect transistor.

6. The semiconductor device according to claim 1, wherein one of the first gate electrode and the second gate electrode is provided at the inner side of the other in a planar layout.

* * * * *